United States Patent
Baburske et al.

(10) Patent No.: US 9,899,478 B2
(45) Date of Patent: Feb. 20, 2018

(54) DESATURABLE SEMICONDUCTOR DEVICE WITH TRANSISTOR CELLS AND AUXILIARY CELLS

(71) Applicant: Infineon Technologies AG, Neubiberg (DE)

(72) Inventors: Roman Baburske, Otterfing (DE); Johannes Georg Laven, Taufkirchen (DE)

(73) Assignee: Infineon Technologies Austria AG, Villach (DE)

( * ) Notice: Subject to any disclaimer, the term of this patent is extended or adjusted under 35 U.S.C. 154(b) by 44 days.

(21) Appl. No.: 15/188,742

(22) Filed: Jun. 21, 2016

(65) Prior Publication Data

US 2017/0018633 A1   Jan. 19, 2017

(30) Foreign Application Priority Data

Jul. 14, 2015   (DE) .................. 10 2015 111 347

(51) Int. Cl.
   *H01L 29/73*    (2006.01)
   *H01L 29/10*    (2006.01)
   *H01L 27/02*    (2006.01)
   *H01L 29/423*   (2006.01)
   *H01L 29/739*   (2006.01)
   *H01L 29/06*    (2006.01)
   *H01L 29/08*    (2006.01)

(52) U.S. Cl.
   CPC ...... *H01L 29/1095* (2013.01); *H01L 29/0696* (2013.01); *H01L 29/0834* (2013.01); *H01L 29/4238* (2013.01); *H01L 29/42376* (2013.01); *H01L 29/7397* (2013.01)

(58) Field of Classification Search
   CPC ... H01L 29/10; H01L 29/109; H01L 29/1095; H01L 29/73; H01L 29/739; H01L 29/7395; H01L 27/02; H01L 27/02; H01L 27/0207
   USPC .......................................... 257/139
   See application file for complete search history.

(56) References Cited

U.S. PATENT DOCUMENTS

2015/0076554 A1*  3/2015  Laven .............. H01L 29/6634
                                              257/139

FOREIGN PATENT DOCUMENTS

| DE | 102014100249 A1 | 7/2014 |
|----|-----------------|--------|
| DE | 102014117364 A1 | 5/2015 |
| DE | 102014117767 A1 | 6/2015 |

OTHER PUBLICATIONS

Office Action communication of the German Patent and Trademark Office for Appln. Serial No. 102015111347.3, dated Mar. 29, 2016.

* cited by examiner

*Primary Examiner* — Monica D Harrison
(74) *Attorney, Agent, or Firm* — Baker Botts L.L.P.

(57) ABSTRACT

A semiconductor device includes transistor cells that connect a first load electrode with a drift structure forming first pn junctions with body zones when a gate voltage applied to a gate electrode exceeds a first threshold voltage. First auxiliary cells in a vertical projection of and electrically connected with the first load electrode are configured to inject charge carriers into the drift structure at least in a forward biased mode of the first pn junctions. Second auxiliary cells are configured to inject charge carriers into the drift structure at high emitter efficiency when in the forward biased mode of the first pn junctions the gate voltage is below a second threshold voltage lower than the (Continued)

first threshold voltage and at low emitter efficiency when the gate voltage exceeds the second threshold voltage.

25 Claims, 18 Drawing Sheets

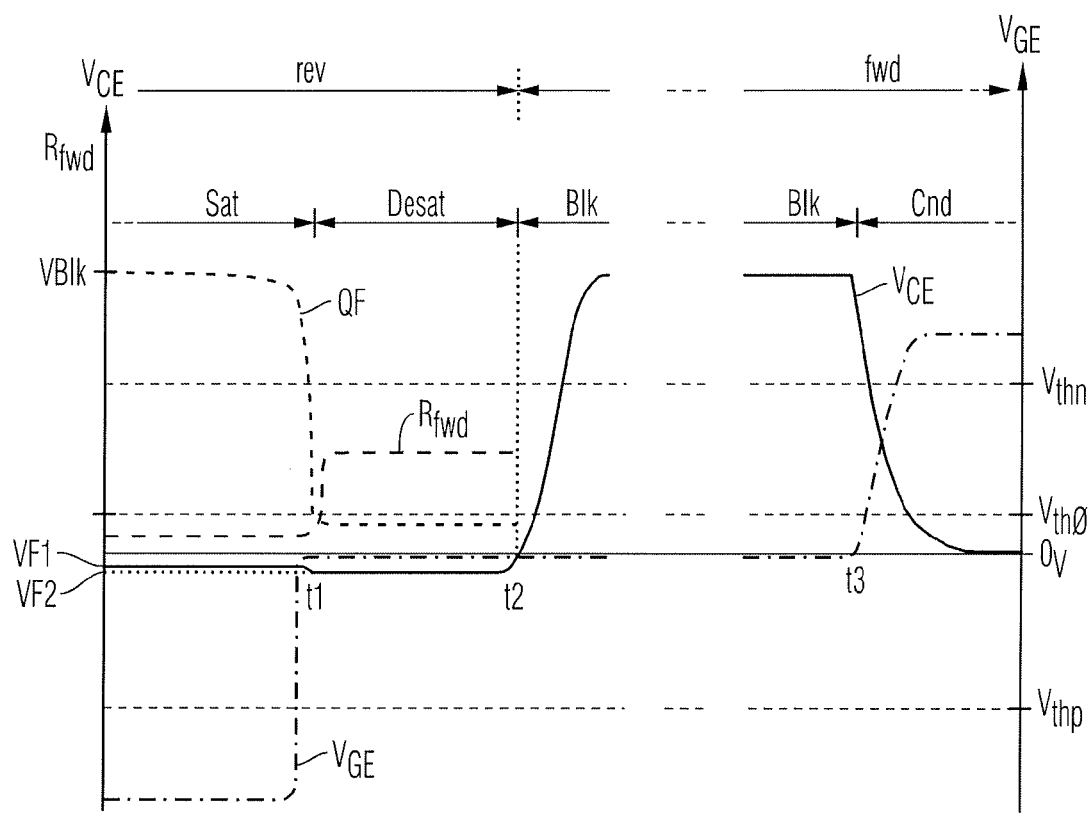

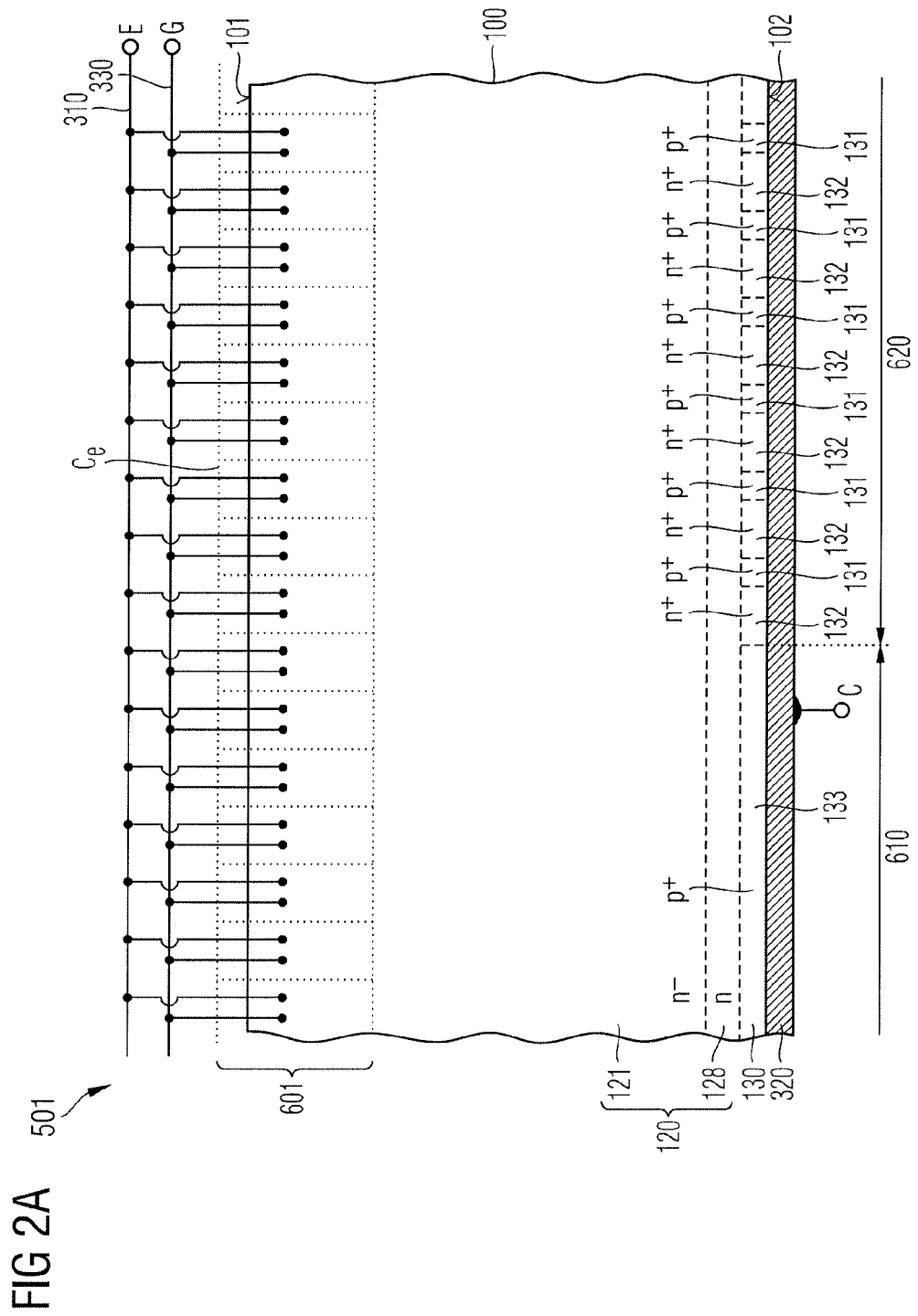

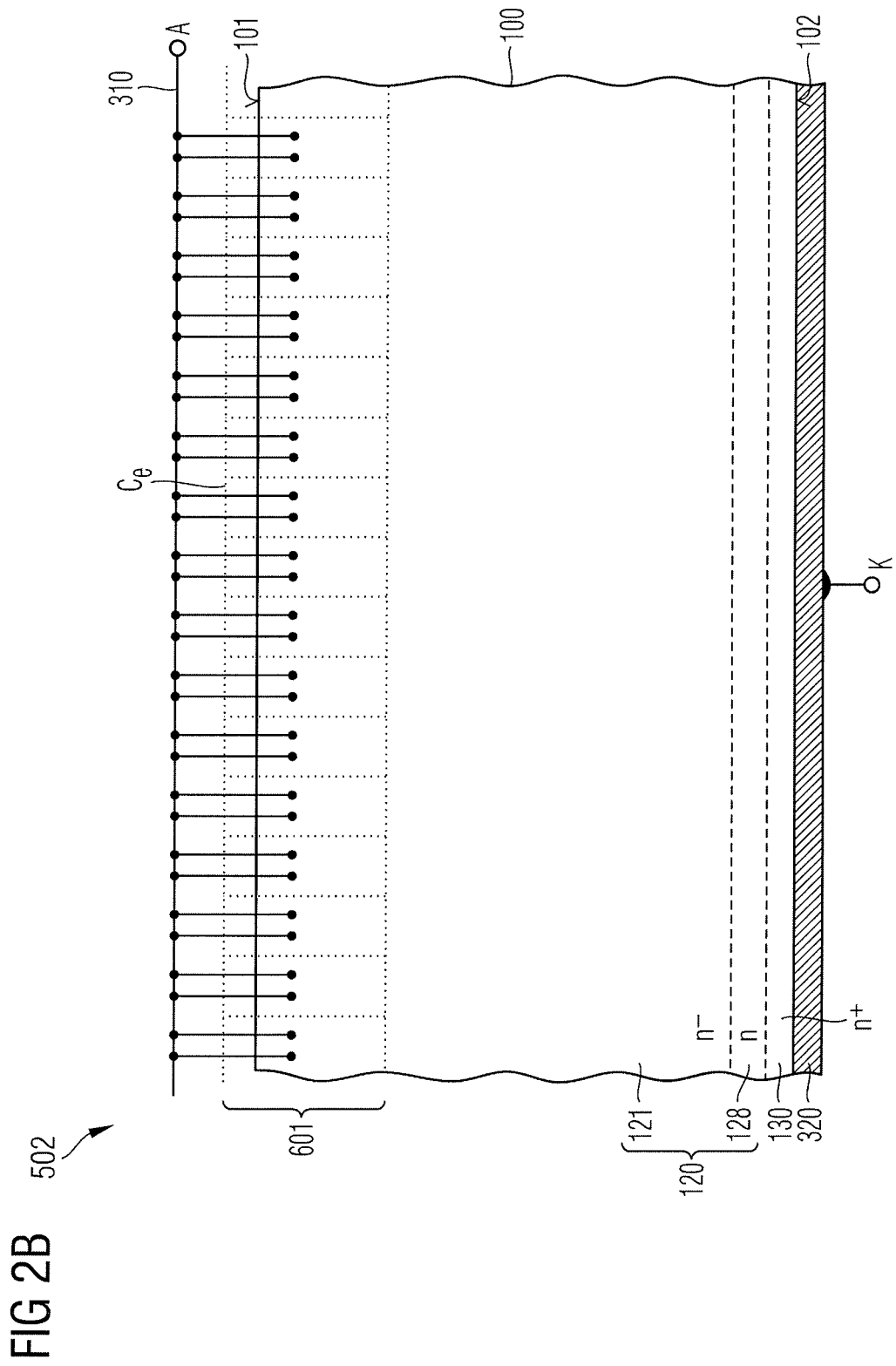

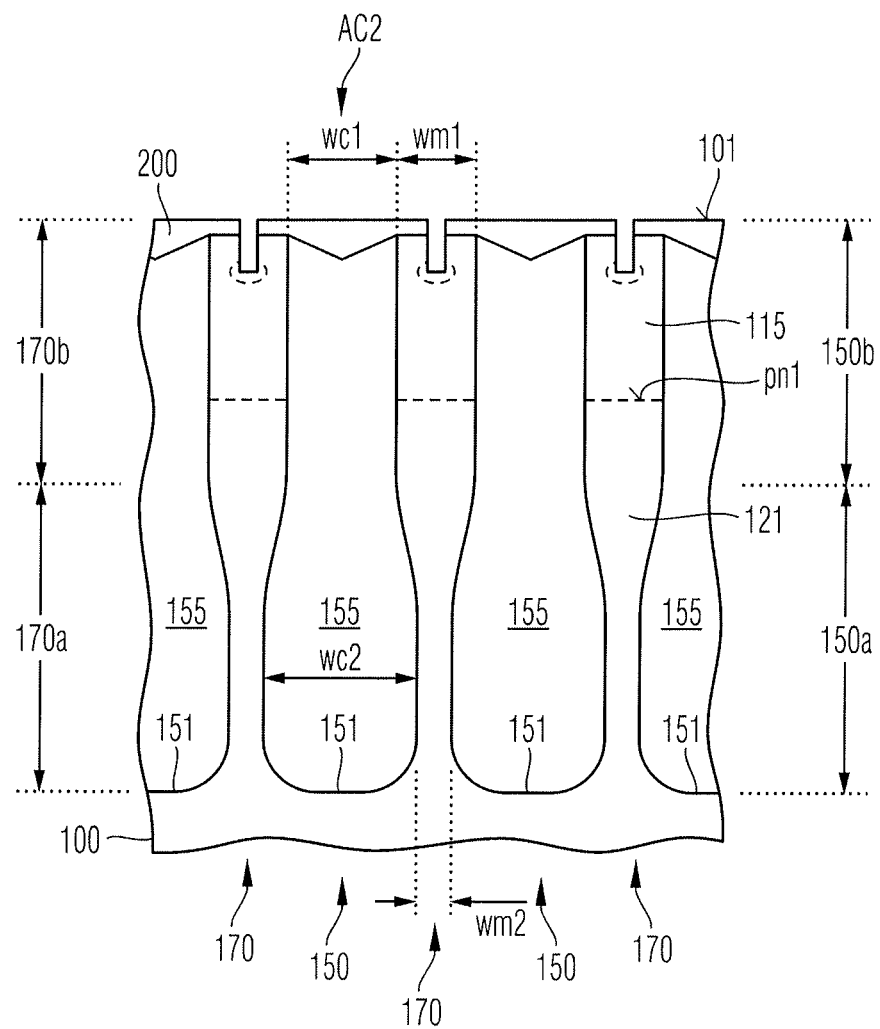

DESATURABLE SEMICONDUCTOR DEVICE WITH TRANSISTOR CELLS AND AUXILIARY CELLS

CROSS-REFERENCE TO RELATED APPLICATION

This application claims priority to German Application Serial No. 102015111347.3 filed Jul. 14, 2015 and entitled "Desaturable Semiconductor Device with Transistor Cells and Auxiliary Cells."

BACKGROUND

In semiconductor devices including both transistor cells and a diode functionality such as MCDs (MOS controlled diodes) and RC-IGBTs (reverse conducting insulated gate bipolar transistors), mobile charge carriers flood a semiconductor region along a forward biased pn junction and form a dense charge carrier plasma resulting in a low forward resistance of the diode. When the concerned pn junction commutates thereby changing from forward biased to reverse biased, a reverse recovery current removes the charge carrier plasma. The reverse recovery current contributes to dynamic switching losses of the semiconductor device. Typically, in a desaturation period preceding the change of the pn junction from forward biased to reverse biased a gated MOS channel attenuates the charge carrier plasma in order to reduce the dynamic switching losses. A safety period between the end of the desaturation period and the beginning of the commutation secures that the semiconductor device is in a blocking mode with closed MOS channel before commutation starts. During the safety period the charge carrier plasma partially recovers and foils to some degree the desaturation mechanism.

It is desirable to improve the switching characteristics of semiconductor devices including transistor cells as well as a diode functionality.

SUMMARY

According to an embodiment a semiconductor device includes transistor cells configured to connect a first load electrode with a drift structure forming first pn junctions with body zones when a gate voltage applied to a gate electrode exceeds a first threshold voltage. First auxiliary cells in a vertical projection of and electrically connected with the first load electrode are configured to inject charge carriers into the drift structure at least in a forward biased mode of the first pn junctions. Second auxiliary cells are configured to inject charge carriers into the drift structure at high emitter efficiency when in the forward biased mode of the first pn junctions the gate voltage is below a second threshold voltage lower than the first threshold voltage and at low emitter efficiency when the gate voltage exceeds the second threshold voltage.

According to an embodiment, a semiconductor device includes a semiconductor body that includes a drift structure and cell mesas formed between gate structures that extend from a first surface of the semiconductor body into the drift structure. The cell mesas include bottleneck sections and wide sections between the bottleneck sections and the first surface, wherein the wide sections are wider than narrow portions of the bottleneck sections. Transistor cells include body zones forming first pn junctions with the drift structure and second pn junctions with source zones. First auxiliary cells are electrically connected in parallel to the transistor cells and second auxiliary cells are electrically connected in parallel to the transistor cells, wherein the narrow portions of the bottleneck sections in the first auxiliary cells are wider than the narrow portions of the bottleneck sections in the second auxiliary cells.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 1C is a schematic timing diagram illustrating a method of operating the semiconductor device of FIG. 1A.

FIG. 2A is a schematic vertical cross-sectional view of a portion of a semiconductor device according to an embodiment related to RC-IGBTs.

FIG. 2B is a schematic vertical cross-sectional view of a portion of a semiconductor device according to an embodiment related to MCDs.

FIG. 8A is a schematic vertical cross-sectional view of a portion of a semiconductor device with injection cells based on cell mesas including bottleneck sections for illustrating effects of the embodiments.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. Corresponding elements are designated by the same reference sign in the different drawings, respectively, if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example resistors or elements that are controllable to temporarily provide a low-ohmic connection in a first state and a high-ohmic electric decoupling in a second state.

Figure 1A:
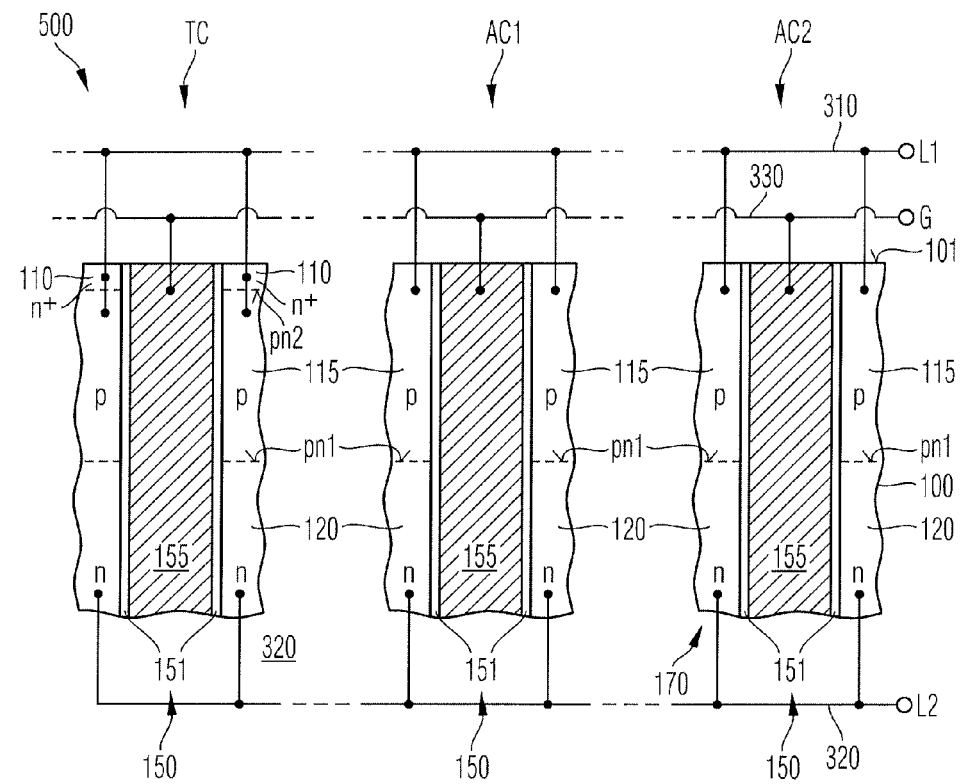
FIG. 1A combines schematic vertical cross-sectional views of portions of a semiconductor device with transistor cells, first auxiliary cells and second auxiliary cells according to an embodiment.

FIG. 1A shows a portion of a semiconductor device 500, for example an MCD such as an MGD (MOS-gated diode) with shorted gate, an RC-IGBT or a device including an MCD or RC-IGBT functionality. Silicon (Si), silicon carbide (SiC), germanium (Ge), a silicon germanium crystal (SiGe), gallium nitride (GaN), gallium arsenide (GaAs) or any other $A_{III}B_V$ semiconductor forms a semiconductor body 100 of the semiconductor device 500.

At a front side the semiconductor body 100 has a first surface 101 which may be approximately planar or which may be spanned by coplanar surface sections. A minimum distance between the first surface 101 and a mainly planar second surface at an opposite rear side and parallel to the first surface 101 defines the voltage blocking capability of the semiconductor device 500. For example, the semiconductor body 100 of an RC-IGBT specified for a blocking voltage of about 1200 V may have a thickness of 90 μm to 110 μm. Embodiments related to higher blocking capabilities may be based on semiconductor bodies 100 with a thickness of several 100 μm.

In a plane perpendicular to the cross-sectional plane, the semiconductor body 100 may have an approximately rectangular shape with an edge length in the range of several millimeters. A normal to the first surface 101 defines a vertical direction and directions orthogonal to the vertical direction are horizontal directions.

The semiconductor body 100 includes a drift structure 120 of a first conductivity type. The drift structure 120 forms first pn junctions pn1 with body zones 115 of the second conductivity type, wherein the body zones 115 are formed between the first surface 101 and the drift structure 120.

Transistor cells TC, first auxiliary cells AC1 and second auxiliary cells AC2 are formed along gate structures 150 extending from the first surface 101 down to at least the first pn junctions pn1.

The gate structures 150 include a conductive gate electrode 155 and a gate dielectric 151 separating the gate electrode 155 from the semiconductor body 100. The gate electrode 155 may be a homogeneous structure or may have a layered structure including one or more metal containing layers. According to an embodiment, the gate electrode 155 may include or consist of a heavily doped polycrystalline silicon layer. The gate electrode 155 may be electrically connected to a gate connector 330 outside the semiconductor body 100. The gate connector 330 may form or may be electrically coupled or connected to a gate terminal G.

The gate dielectric 151 may have a uniform thickness. According to other embodiments, a bottom portion of the gate dielectric 151 averted from the first surface 101 may be thicker than a top portion oriented to the first surface 101. The gate dielectric 151 may include or consist of a semiconductor oxide, for example thermally grown or deposited silicon oxide, a semiconductor nitride, for example deposited or thermally grown silicon nitride, or a semiconductor oxynitride, for example silicon oxynitride.

The transistor cells TC further include source zones 110 of the first conductivity type forming second pn junctions pn2 with body zones 115 assigned to the transistor cells TC. The source zones 110 are formed between the first surface 101 and the body zones 115 of the transistor cells TC.

The source zones 110 of the transistor cells TC as well as the body zones 115 of the first and second auxiliary cells AC1, AC2 are electrically connected to a first load electrode 310 which may form or which may be electrically coupled or connected to a first load terminal L1. The body zones 115 of the transistor cells TC may also be electrically connected to the first load electrode 310. The drift structure 120 is electrically connected to a second load electrode 320 which may form or which may be electrically coupled or connected to a second load terminal L2.

At gate voltages above a first threshold voltage Vthn inversion layers are formed in the body regions 115 of the transistor cells TC as well as in the first and second auxiliary cells AC1, AC2 along the gate dielectric 151. The inversion layers in the transistor cells TC form MOS gated channels for minority charge carriers between the source zones 110 and the drift structure 120. The inversion layers in the first and second auxiliary cells AC1, AC2 are without connection to the first load electrode 310. The first and second auxiliary cells AC1, AC2 differ from each other as regards a relationship between a forward voltage across the respective single auxiliary cells AC1, AC2 and the gate voltage when the first pn junctions pn1 are forward biased.

The first pn junctions pn1 are forward biased in case of a forward biased MCD with a positive voltage applied between the first load terminal L1 (anode) and the second load terminal L2 (cathode) or, in case of a reverse biased RC-IGBT with a negative voltage applied between the second load terminal L2 (collector) and the first load terminal L1 (emitter). The first and second auxiliary cells AC1, AC2 differ from each other with respect to their behavior concerning charge carrier injection efficiency.

The different charge carrier injection characteristics of the first and second auxiliary cells AC1, AC2 may result from different emitter efficiencies, wherein emitter efficiency is the ratio of the hole current density to the total current density. A variation of emitter efficiency may be achieved by different vertical dopant profiles through the first pn junctions pn1, by way of example.

According to another embodiment, the first and second auxiliary cells AC1, AC2 may have equal or similar emitter efficiencies but differ from each other with respect to a width of the body zones 115 and/or the first pn junctions pn1 between neighboring gate structures 150. In the first auxiliary cells AC1 an injection efficiency given by the integral across the emitter efficiency from one side of the concerned cell to the opposite side may be greater than the injection efficiency in the second auxiliary cells AC2. According to a further embodiment, the auxiliary cells AC1, AC2 may have both different emitter efficiencies and horizontal dimensions.

An inversion channel formed along a gate structure 150 and connected with the body zone 115 of an auxiliary cell AC1, AC2 increases the injection efficiency of the concerned cell such that injection efficiency at least of the second auxiliary cells AC2 may be controlled by the gate-to-emitter voltage VGE.

During a saturation period the second auxiliary cells AC2 are effective as saturation injections cells injecting charge carriers into the drift structure 120 at a high rate and establishing a dense charge carrier plasma. In a desaturation period the saturation injection cells AC2 are considerably less active such that the charge carrier plasma partially dissipates. For example, during desaturation the mean injection efficiency of the saturation injection cells AC2 for VGE>Vth2 may be at most 50%, or at most 10%, or at most 1% of the mean injection efficiency of the saturation injection cells AC2 for VGE<Vth2.

Instead, during the desaturation period, the first auxiliary cells AC1, which are effective as desaturation injection cells, still inject sufficient charge carriers to maintain a sufficiently low forward voltage VF across the desaturation injection cells AC1.

During both the desaturation period and the saturation period, all types of cells AC1, AC2, TC may inject charge carriers into the drift structure 120, but in the desaturation period the saturation injection cells AC2 inject at significantly reduced injection efficiency compared to the saturation period such that in total less charge carriers are injected into the drift structure 120.

By providing two different types of injection cells, one type may be adapted to the requirements of the saturation period and the other type can be adapted to the requirements of the desaturation period. Compared to approaches with only one type of desaturation cells, process constrictions can be relaxed and device parameters for the saturation period and the desaturation period can be tuned independently from each other.

Figure 1B:
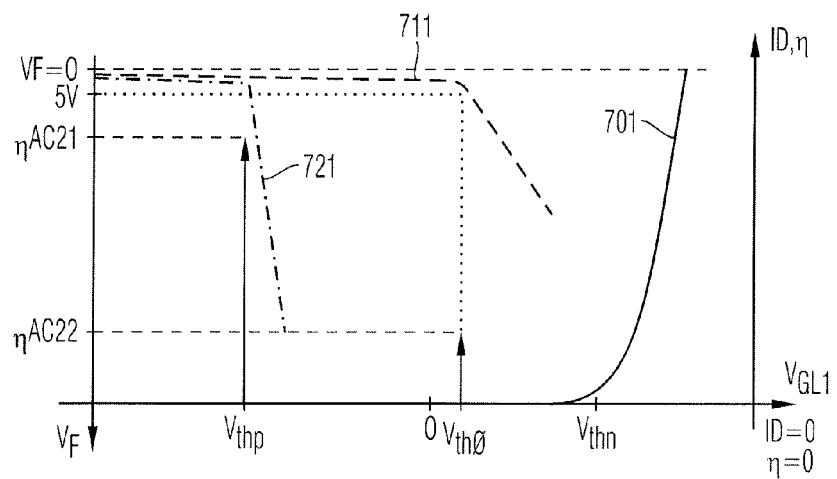
FIG. 1B is a schematic diagram illustrating characteristics of the transistor cells, first auxiliary cells and second auxiliary cells of FIG. 1A for discussing effects of the embodiments.

FIG. 1B illustrates the different characteristics of the transistor cells TC, the desaturation injections cells AC1 and the saturation injection cells AC2. The following discussion refers to p-type body zones 115 and n-type source zones 110 as, e.g., in an n-channel RC-IGBT. Corresponding considerations apply to semiconductor devices 500 with p-type source zones 110 and n-type body zones 115 as, e.g., in p-channel RC-IGBTs.

According to forward characteristic 701, when a gate voltage VGL1 applied between the gate terminal G and the first load terminal L1 exceeds the first threshold voltage Vthn, inversion layers formed in the body zones 115 of the transistor cells TC along the gate dielectrics 151 form MOS gated channels that connect the source zones 110 with the drift structure 120 and that provide an electron path between the first load electrode 310 and the drift structure 120. At the same time, due to the absence of source zones or a missing connection between such source zones and the first load electrode 310, inversion layers formed in the body zones 115 of the desaturation and saturation injection cells AC1, AC2 are without connection to the first load electrode 310. This holds both when a positive voltage is applied between the first load terminal L1 and the second load terminal L2 and when a negative voltage is applied between the first load terminal L1 and the second load terminal L2. The first reverse characteristic 711 illustrates the relationship between a forward voltage VF across single desaturation injection cells AC1 and the gate voltage VGL1 in a forward biased mode of the first pn junction pn1 with a negative voltage applied between the second load terminal L2 and the first load terminal L1. At least for a gate voltage VGL1 below a further threshold voltage Vth0, single desaturation injection cells AC1 have a low forward voltage VF of at most 0.2%, e.g., at most 0.15%, of the maximum blocking voltage the semiconductor device 500 is specified for. For example, the forward voltage VF is at most 2V for a semiconductor device with a blocking capability of 1200V or at most 5V for a semiconductor device with a blocking capability of 6.5 kV. According to an embodiment, the forward voltage VF is at most 20V at a nominal reverse current.

When the gate voltage VGL1 exceeds the further threshold voltage Vth0, the forward voltage VF may increase with increasing VGL1 or may remain approximately constant up to beyond the first threshold voltage Vthn. According to an embodiment, the injection efficiency of the desaturation injection cells AC1 sharply decreases and the forward voltage VF across the desaturation injection cells AC1 increases for VGL1>Vth0 to keep the impact of the desaturation injection cells AC1 on other device parameters low. Below the further threshold voltage Vth0 an increase of the forward voltage drop across the first desaturation injection cells AC1 with increasing gate-to-emitter voltage VGE is less steep than above the further threshold voltage Vth0. The second reverse characteristic 721 illustrates the relationship between a forward voltage VF across single saturation injection cells AC2 and the gate voltage VGL1 in the forward biased mode of the first pn junction pn1. For a gate voltage VGL1 below a second threshold voltage Vthp which is lower than the further threshold voltage Vth0, the forward voltage across a single saturation injection cell AC2 is at most 5V. For VGL1>Vthp the forward voltage drop across single saturation injection cells AC2 sharply increases with increasing VGL1 indicating that the charge carrier injection efficiency of the saturation injection cells AC2 sharply decreases between Vthp and Vth0. Below the second threshold voltage Vthp an increase of the forward voltage drop across the saturation injection cells AC2 with increasing gate-to-emitter voltage VGE is less steep than above the further threshold voltage Vthp.

FIG. 1B further shows that an overall charge carrier injection efficiency ηAC21 of the saturation injection cells AC2 for VGL1<Vthp is higher than an overall charge carrier injection efficiency ηAC22 of the saturation injection cells AC2 for VGL1=Vth0, wherein the overall charge carrier injection efficiency is the surface integral over the local emitter efficiency for the respective cell type. The desaturation injection cells AC1 may show a lower overall charge carrier injection efficiency than the saturation injection cells AC2 for VGL1<Vthp but maintain a sufficient charge carrier injection efficiency at least up to VGL1=Vth0 such that despite of the comparatively low overall charge carrier injection efficiency the desaturation injection cells AC1 can maintain a low forward voltage VF for the desaturation period with a gate voltage VGL1 between the second threshold voltage Vthp and the further threshold voltage Vth0.

Typically, three-level approaches for desaturable RC-IGBTs rely on injection cells designed with a large spread between a high injection efficiency at a gate-to-emitter voltage VGE of −15 V on the one hand and a low injection efficiency at VGE=0 V on the other hand. During an injection period of a reverse conducting mode (RC-mode) of the RC-IGBT, in which the first pn junctions pn1 are forward biased. The injection cells are active and inject charge carriers into the drift structure 120 at high injection efficiency to achieve a dense charge carrier plasma. In a desaturation period preceding commutation, hence before the voltage between the first and second load terminals L1, L2 changes polarity, the injection cells are deactivated and inject charge carriers only at a significantly lower injection efficiency such that the charge carrier plasma density attenuates.

The desaturation is the more effective the greater the spread of the injection efficiency is. However, when forming injection cells with high spread between the injection mode and the desaturation mode, it turns out that the forward voltage VF at VGE=0 may strongly depend on process fluctuations.

Instead, the present embodiments rely on two types of injection cells. The saturation injection cells AC2 may be designed with a high spread between the injection efficiency at VGL1=−15 V and the injection efficiency at VGL1=0 V such that a high desaturation efficiency can be achieved. The desaturation injection cells AC1 may be designed with no or a low spread between the injection efficiency at VGL1=−15 V and the injection efficiency at VGL1=0 V but with an injection efficiency that assures a sufficient low forward voltage VF, e.g. less than 3 V, at and close to VGL1=0 V, wherein the forward voltage drop VF is less prone to process fluctuations. As a result, the embodiments combine high desaturation efficiency with persistently low forward voltage VF even during the desaturation period.

FIG. 1C schematically shows the mode of operation of an RC-IGBT based on the semiconductor device 500 of FIGS. 1A and 1B.

During a saturation period Sat of the RC-mode of the RC-IGBT, a gate-to-emitter voltage VGE is below Vthp and the saturation injection cells AC2 inject charge carriers at high efficiency into the drift structure 120 resulting in a high storage charge QF. The collector-to-emitter voltage VCE is given by the forward voltage VF1 of the reverse diode during the saturation period Sat, wherein the characteristics of the reverse diode are governed by the saturation injection cells AC2. The forward voltage VF1 as well as the forward resistance Rfwd of the reverse diode is low.

At t=t1, VGE rises to Vthp<VGE<Vth0 and a desaturation period Desat starts. The saturation injection cells AC2 switch to a low injection mode. The charge carrier plasma density and the storage charge sharply decrease whereas forward voltage rises and forward resistance Rfwd increases. But the desaturation injection cells AC1 are still active and ensure an ongoing comparatively low forward voltage VF2 of the reverse diode.

After some time a process may be triggered that may change the voltage bias across the RC-IGBT. For example, a semiconductor switch in the other part of a half bridge is turned-on while the RC-IGBT remains turned off. During turn-off the voltage bias of the RC-IGBT may repeatedly change from reverse biased to forward biased and vice versa. Finally, the voltage bias may change to forward biased whereby the RC-IGBT commutates and may directly change into a blocking state.

Since the charge carrier plasma density has been reduced, a smaller number of charge carriers have to be drained off from the semiconductor body 100 than without desaturation period Desat and switching losses are reduced. Since desaturation gets along without formation of any MOS gated channel, the RC-IGBT can immediately sustain the full blocking voltage in a blocking phase Blk of the forward biased state. When the commutation charge carrier flow ends, the gate voltage may be again lowered to below the second threshold voltage in order to improve robustness against strong current filaments in the wake of the commutation charge carrier flow and to avoid a dynamic increase of the gate potential above Vthn.

Later, e.g., at t=t3, VGE may rise to above Vthn, the MOS gated channels in the transistor cells TC turn on and the RC-IGBT changes to a conducting phase Cnd of the forward biased state.

The first, second and further threshold voltages Vthn, Vthp, Vth0 are selected to meet worst case conditions specified for the gate voltage levels. For example, Vth0 may be selected such that the forward voltage of the desaturation injection cells AC1 is below 15V for a 1200V device over the whole admissible gate voltage range for the desaturation mode. The second threshold voltage Vthp may be selected such that the second auxiliary cells AC2 contribute to overall hole injection only to a low degree, e.g., at most 30%, or at most 15%, or at most 5% over the complete admissible gate voltage range for the desaturation mode.

For example, datasheets of depletable three-level RC-IGBTs may specify gate voltage levels of +10 to +25 V for switching on the MOS-gated channels, −3 V to +3 V for the desaturation mode and −15 to −25 V for the saturation mode. For an RC-IGBT with the above specifications, the first threshold voltage Vthn may be about half way between +1 V and +10 V, e.g. close to 5.5 V. The further threshold voltage Vth0 may be between the maximum admissible voltage level for the desaturation mode and the first threshold voltage Vthn, hence in a range between +1.0 V and +5.0 V, for example between 2 V and 3 V. The second threshold voltage Vthp may be half way between −15 V and the minimum admissible voltage level for the desaturation mode, hence in a range between −10 V and −1 V, for example at −5.5 V.

FIG. 2A illustrates an RC-IGBT or a semiconductor device including an RC-IGBT 501 according to an embodiment. At a front side of a silicon semiconductor body 100 including a drift structure 120 as described above a transistor module 601 includes controllable cells Ce, which may be transistor cells TC, desaturation injection cells AC1 or saturation injection cells AC2 as described above. Control electrodes of the controllable cells CE are electrically connected to a gate conductor 330, which may form or which may be electrically connected or coupled to a gate terminal G. Source and body zones of the controllable cells CE are electrically connected to a first load electrode 310, which may form or which may be electrically connected or coupled to an emitter terminal E.

The drift structure 120 includes a drift zone 121 and may directly adjoin to the body zones in the controllable cells Ce. According to other embodiments, a heavier doped barrier layer may be sandwiched between the body zones 115 and the drift zone 121. In the drift zone 121, a dopant concentration may gradually or in steps increase or decrease with increasing distance to the first surface 101 at least in portions of its vertical extension. According to other embodiments, the dopant concentration may be approximately uniform in the complete drift zone 121. A mean dopant concentration in the drift zone 121 may be between $1E12$ cm$^{-3}$ and $1E15$ cm$^{-3}$, for example in a range from $5E12$ cm$^{-3}$ to $5E13$ cm$^{-3}$.

A pedestal layer 130 formed along a second surface 102 at an opposite rear side directly adjoins a second load electrode 320 which may form or which may be electrically connected to a collector terminal C. The pedestal layer 130 includes first zones 131 of the conductivity type of the body zones 115 and second zones 132 of the conductivity type of the drift structure 120. The first and second zones 131, 132 extend from the drift structure 120 to the second load electrode 320, respectively. The first zones 131 are effective as rear side emitter zones injecting minority charge carriers into the drift structure 120 in a conducting phase of the forward biased state. The second zones 132 are effective as collector shorts bypassing the rear side emitter zones in the RC-mode. The first zones 131 may alternate with the second zones 132 in a bimodal region 620 of the RC-IGBT 501. In addition to the bimodal region 620, the RC-IGBT 501 may include a pilot region 610 with a pilot zone 133, wherein a horizontal extension of the pilot zone 133 is at least twice, e.g. at least ten times as large as a horizontal extension of the first zones 131 in the bimodal region 620. The pilot zone 133 supports ignition of the conducting phase of the forward biased state.

The dopant concentrations in the first and second zones 131, 132 and, if applicable, in the pilot zone 133, are sufficiently high to ensure a low ohmic contact to the second load electrode 320. For example, a maximum dopant concentration along the second surface 102 in p doped first, second or pilot zones 131, 132, 133 may be at least $1E16$ cm$^{-3}$, for example at least $5E17$ cm$^{-3}$. A maximum dopant concentration in n-doped first, second or pilot zones 131, 132, 133 may be at least $1E18$ cm$^{-3}$.

The drift structure 120 may include a field stop layer 128 of the conductivity type of the drift zone 121, wherein the field stop layer 128 separates the drift zone 121 from the pedestal layer 130. A mean net dopant concentration in the field stop layer 128 is at least twice as high as a maximum net dopant concentration in the drift zone 121 and at most half as high as the mean dopant concentration in the second zones 132 of the pedestal layer 130. The drift structure 120 may include further doped zones, for example zones forming a compensation structure, barrier zones for locally increasing a charge carrier plasma density and/or buffer zones locally shaping the electric field.

FIG. 2B refers to an MCD 502 or a semiconductor device comprising an MCD 502. The source and body zones of the controllable cells Ce may be electrically connected to the first load electrode 310, which may form or which may be electrically connected to an anode terminal A. The gate electrodes of the controllable cells Ce may be electrically connected a gate terminal or to the first load electrode 310. The pedestal layer 130 is a heavily doped layer of the conductivity type of the drift zone 121, wherein a maximum net dopant concentration in the pedestal layer 130 along the second surface 102 ensures a low ohmic contact to the second load electrode 320, which forms or which is electrically connected to a cathode terminal K. For further details reference is made to the description of the RC-IGBT 501 of FIG. 2A.

The total area ratio of desaturation injection cells AC1 to saturation injection cells AC2 may range from 1:1 to 1:10000, e.g., from 1:20 to 1:500. The total area ratio of transistor cells TC to injection cells AC1, AC2 may be in a range from 200:1 to 1:50, e.g., from 10:1 to 1:10. Placement of the saturation and desaturation injection cells AC2, AC1 may be unrelated to the position of the first, second and pilot zones 131, 132, 133 at a rear side.

Figure 3A:
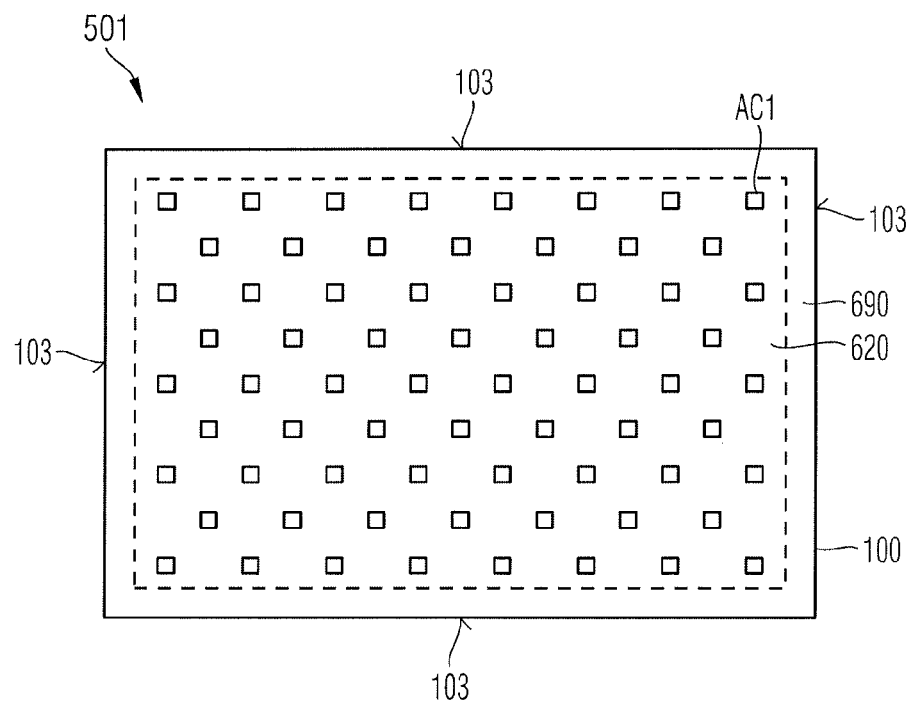
FIG. 3A is a schematic horizontal cross-sectional view of an RC-IGBT according to an embodiment with evenly distributed first auxiliary cells.

In FIG. 3A, the RC-IGBT 501 includes a bipolar region 620 and comparatively small first auxiliary cells AC1 are evenly distributed within the complete bipolar region 620. Evenly distributed desaturation injection cells AC1 avoid high local current densities during commutation. An avalanche induced portion of a reverse recovery charge Qrr can be kept small. According to other embodiments, the saturation and desaturation injection cells AC2, AC1 at the front side are aligned to the pattern of the first, second and pilot zones 131, 132, 133 at the rear side.

Figure 3B:
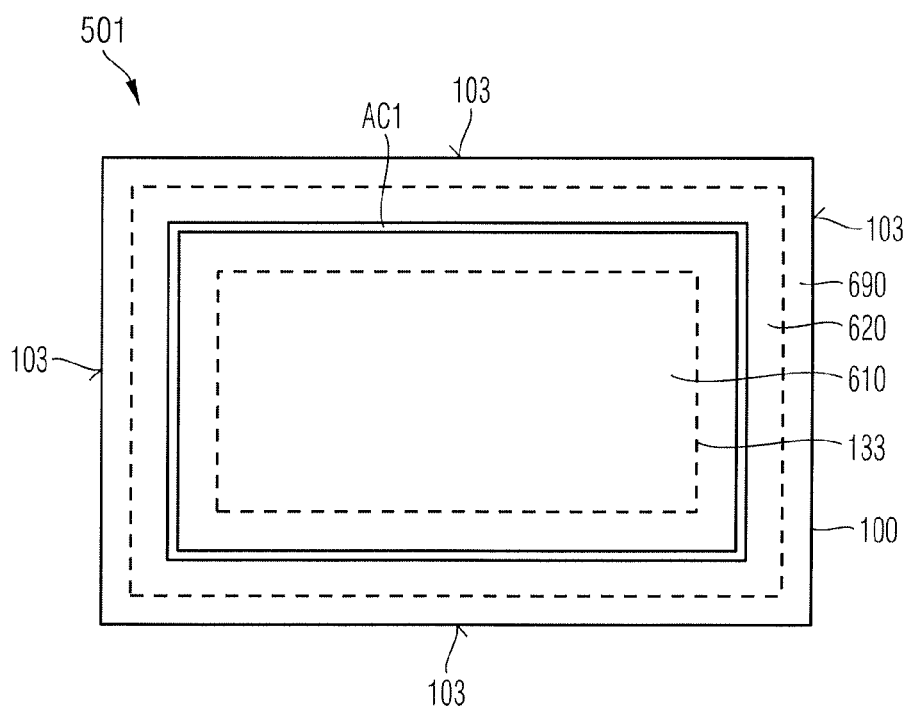
FIG. 3B is a schematic horizontal cross-sectional view of an RC-IGBT according to an embodiment with first auxiliary cells arranged in the center of the diode region.

In FIG. 3B, the desaturation injection cells AC1 are placed in a bimodal region 620 surrounding a pilot region 610. In a portion of the semiconductor body 100 oriented to the rear side, the reverse current mainly flows in the bimodal region 620 during the saturation period of the RC-mode. By placing the desaturation injection cells AC1 only in the bimodal region 620, the reverse current nearly exclusively flows in the bimodal region 620 over the complete vertical extension of the semiconductor body 100 shortly before commutation. Injecting, during the desaturation period, charge carriers exclusively in the bimodal region 620 results in that the charge carrier plasma is concentrated in the bimodal region 620. As a consequence, a commutation charge carrier flow has no or only a weak horizontal component and does not generate a sufficient horizontal voltage drop to ignite charge carrier injection from the pilot region 610. The pilot zone 133 is prevented from unwanted ignition.

As illustrated in FIG. 3B a contiguous desaturation injection cell AC1 may surround the pilot region 610, wherein the desaturation injection cell AC1 may be centered to the bimodal region 620 that surrounds the pilot region 610. A resulting reverse current gain of the pilot region 610 is low. According to other embodiments, a plurality of isolated desaturation injection cells AC1 may be arranged in a stripe centered to the bimodal region 620 and surrounding the pilot region 610.

Figure 3C:
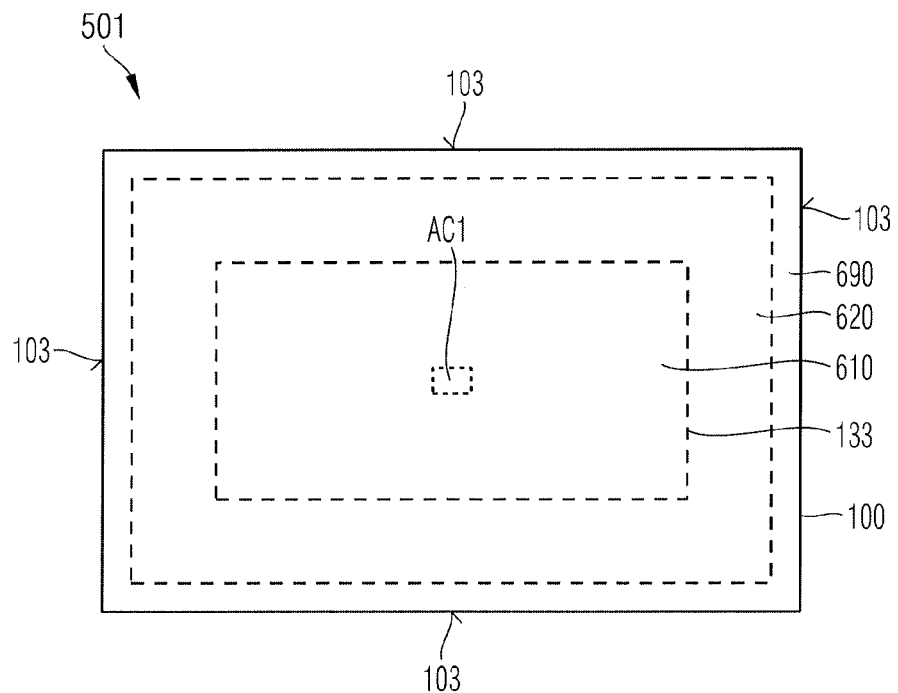
FIG. 3C is a schematic horizontal cross-sectional view of an RC-IGBT according to an embodiment with one or more first auxiliary cells arranged in a center of a pilot region, which is surrounded by a bipolar region.
Figure 3D:
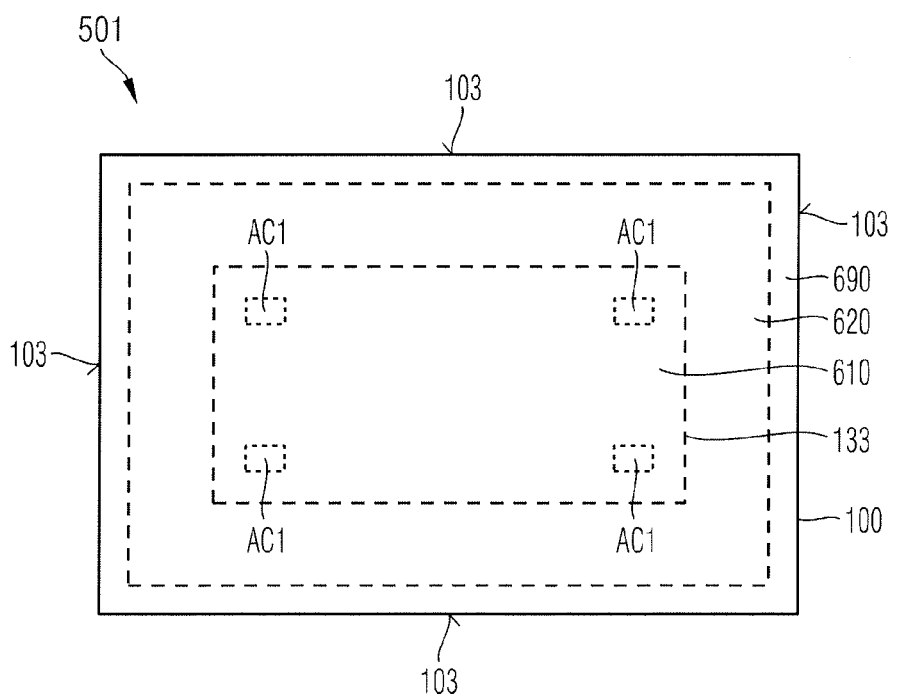
FIG. 3D is a schematic horizontal cross-sectional view of an RC-IGBT according to an embodiment with auxiliary cells arranged in peripheral portions of a pilot region, which is surrounded by a bipolar region.

FIGS. 3C to 3D show RC-IGBTs 501 with the desaturation injection cells AC1 formed in the pilot region 610 in the vertical projection of the pilot zone 133. The desaturation injection cells AC1 locally increase the reverse current gain of the pilot region 610 and in this way may improve switching softness of the RC-IGBT 501. Minority charge carriers that have been previously injected through the desaturation injection cells AC1, e.g., holes in case of an n-channel RC-IGBT 501, may ignite the pilot zone 133 during commutation such that a bipolar transistor formed by the body zones 115, the drift structure 120 and the pilot zone 133 turns on. Ignition of the pilot zone 133 may improve softness of the switching behavior and robustness against oscillations at costs of increased switching losses.

In the RC-IGBT 501 of FIG. 3C one or a small number of desaturation injection cells AC1 is/are placed in the center of the pilot zone 133 to increase the horizontal path lengths of charge carriers previously injected by the desaturation injection cells AC1.

In FIG. 3D, the first desaturation injection cells AC1 are arranged symmetrically in the edges of the pilot region 610 and close to the bimodal region 620 to achieve a tradeoff between low switching losses and high switching softness.

Figure 4:
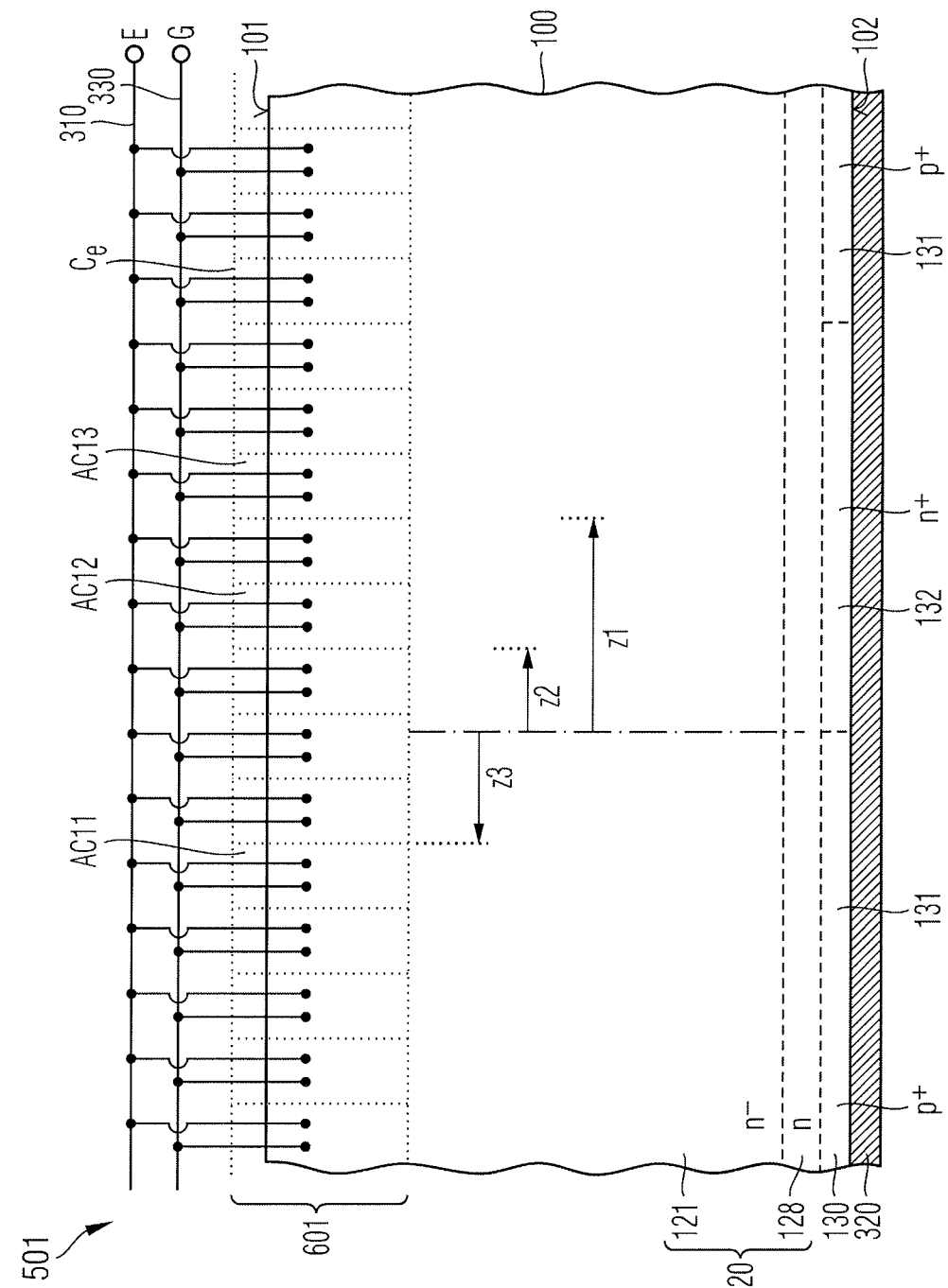
FIG. 4 is a schematic vertical cross-sectional view of an RC-IGBT for illustrating the arrangement of auxiliary cells according to embodiments related to wide collector channels.

FIG. 4 shows possible positions of desaturation injection cells AC11, AC12, AC13 in an RC-IGBT 501 with expanded second zones 132 providing collector shorts for the RC-mode. According to an embodiment with the desaturation injection cells AC11 placed in the vertical projection of the second zones 132 and at a large horizontal distance z1 to the adjoining first zone 131, a reverse current through the semiconductor body 100 during desaturation mainly flows in a vertical direction between the second zones 132 and the desaturation injection cells AC11. Charge carrier plasma density remains low in the vertical projection of the first zones 131. When the RC-IGBT commutates, the resulting commutation charge carrier flow has no or only a weak horizontal component, generates no or only a low horizontal voltage drop along the pn junctions between the first zones 131 and the drift structure 120 and does not ignite the bipolar transistor formed by the body zones 115 of the controllable cells CE, the drift structure 120 and the first zones 131.

By placing the desaturation injection cells AC12, AC13 at a small horizontal distance z2 to the first zones 131 in the vertical projection of the second zones 132 and/or at a horizontal distance z3 to the second zones 132 in the vertical projection of the first zones 131 results in an increased charge carrier plasma density in the vertical projection of the first zones 131, such that a charge carrier flow during commutation has a horizontal component. The resulting horizontal voltage drop may trigger ignition of the bipolar transistor such that switching softness can be improved, if applicable at costs of increased switching losses. Placement of the desaturation injection cells AC11, AC12, AC13 with respect to the second zones 132 forming the collector shorts, as well as number and lateral extension of the desaturation injection cells AC1 determines the conditions at which the commutation charge carrier flow triggers charge carrier injection from the first zones 131.

The desaturation injection cells AC1 differ from the saturation injection cells AC2 in that the desaturation injection cells AC1 have a higher threshold voltage up to which they inject charge carriers at high efficiency. This effect can be achieved by a variation of geometrical dimensions and/or dopant gradients in the injection cells AC1, AC2, by way of example.

Figure 5A:
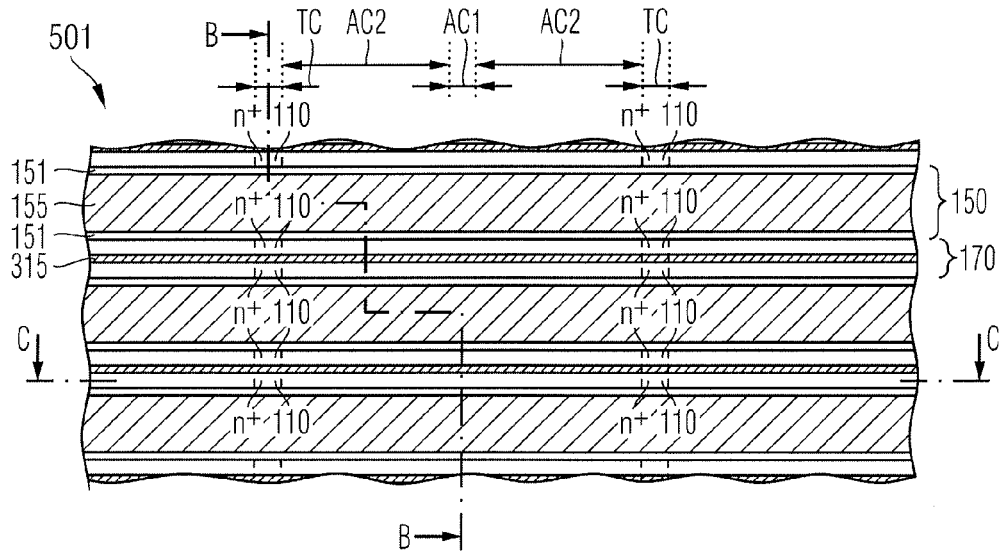
FIG. 5A is a schematic horizontal cross-sectional view of a portion of an RC-IGBT according to an embodiment related to auxiliary cells defined by openings in a barrier structure.
Figure 5B:
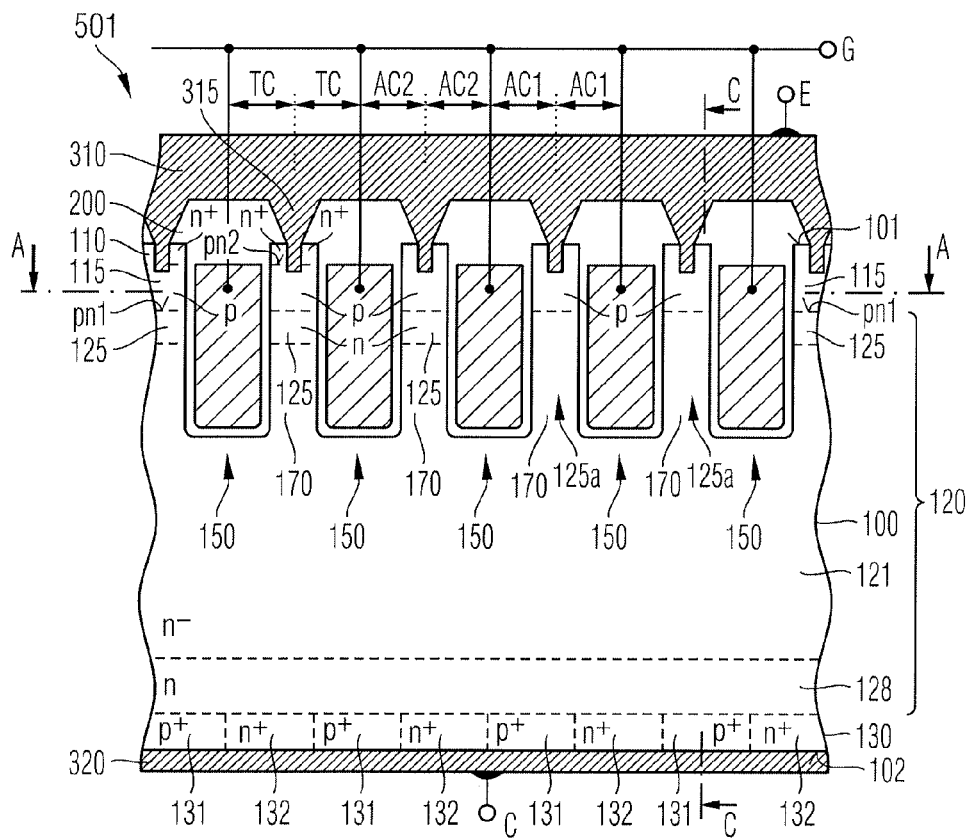
FIG. 5B is a schematic planar projection of a vertical cross-section of the semiconductor device portion of FIG. 5A along line B-B.
Figure 5C:
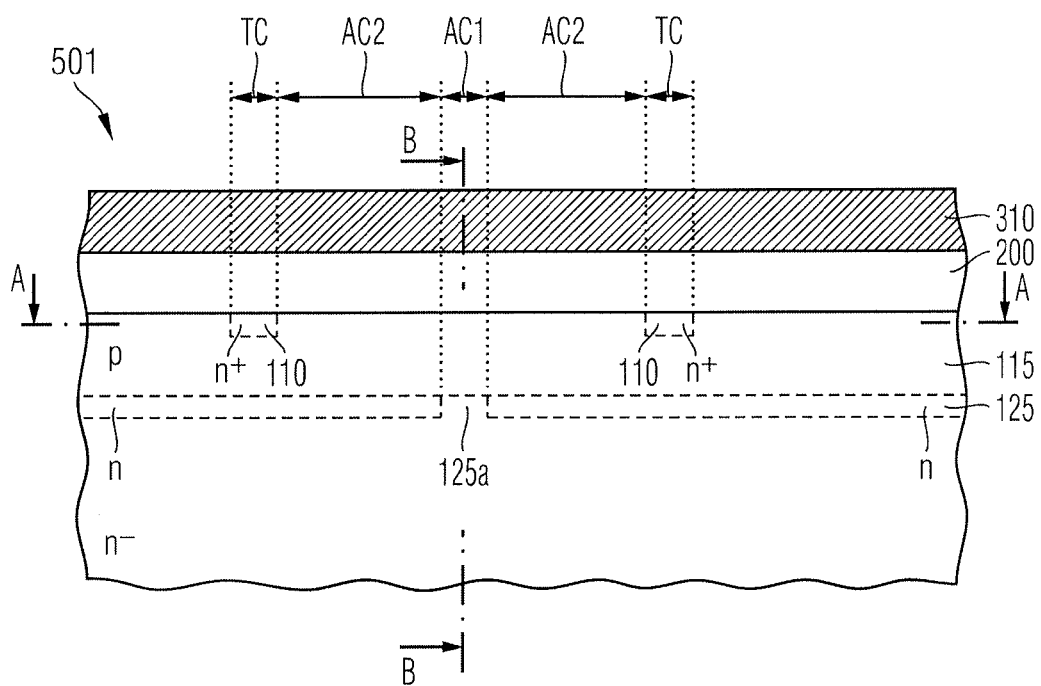
FIG. 5C is a schematic vertical cross-sectional view of the semiconductor device portion of FIG. 5A along line C-C.

FIGS. 5A to 5C refer to RC-IGBTs 501 or other semiconductor devices including an RC-IGBT 501 with desaturation injection cells AC1 formed by a local variation of a barrier structure 125 between the body zones 115 of the injection cells AC1, AC2 and the drift zone 121. The RC-IGBT 501 is based on a semiconductor body 100 as described in detail with regard to FIGS. 1A to 1C, wherein the semiconductor body 100 includes a drift structure 120 of a first conductivity type, a body zone 115 of a second, opposite conductivity type between the first surface 101 and the drift structure 120 as well as a pedestal layer 130 sandwiched between the drift structure 120 and the second surface 102.

For the illustrated n-channel RC-IGBT 501, the first conductivity type is n-type and the second conductivity type is p-type. Similar considerations as outlined below apply to p-channel RC-IGBTs with the first conductivity type being p-type and the second conductivity type being n-type.

The drift structure 120 includes a drift zone 121 with a dopant concentration that may gradually or in steps increase or decrease with increasing distance to the first surface 101 at least in portions of its vertical extension. According to other embodiments the dopant concentration in the drift zone 121 may be approximately uniform. For an RC-IGBT 501 based on silicon, a mean dopant concentration in the drift zone 121 may be between $1E12$ $cm^{-3}$ and $1E15$ $cm^{-3}$, for example in a range from $5E12$ $cm^{-3}$ to $1E14$ $cm^{-3}$. In case of an RC-IGBT 501 based on SiC, a mean dopant concentration in the drift zone 121 may be between $5E14$ $cm^{-3}$ and $1E17$ $cm^{-3}$, for example in a range from $1E15$ $cm^{-3}$ to $1E16$ $cm^3$.

The pedestal layer 130 includes first zones 131 of the conductivity type of the body zones 115 and second zones 132 of the conductivity type of the drift zone 121. The first zones 131 are effective as rear side emitter zones injecting minority charge carriers into the drift zone 121 in the conducting phase. The second zones 132 form collector shorts bypassing the first zones 131 in the RC-mode. Impurity concentrations in the first and second zones 131, 132 are sufficiently high for forming an ohmic contact with a metal directly adjoining the second surface 102. A mean dopant concentration for p-type zones may be at least $1E16$ $cm^{-3}$, for example $5E17$ cm$^{-3}$, and a mean dopant concentration for n-type zones may be at least $1E18$ cm$^{-3}$, for example at least $5E19$ cm$^{-3}$.

The drift structure 120 may include a field stop layer 128 of the conductivity type of the drift zone 121. The field stop layer 128 separates the pedestal layer 130 from the drift zone 121, wherein a mean dopant concentration in the field stop layer 128 may be lower than the mean dopant concentration in the second zones 132 of the pedestal layer 130 by at least 50%, e.g., by at least one order of magnitude and may be higher than in the drift zone 121 by at least 100%, e.g. by at least one order of magnitude.

The first and second zones 131, 132 of the pedestal layer 130 extend from the second surface 102 to the field stop layer 128 or, in absence of a field stop layer, to the drift zone 121, respectively. The first zones 131 may be dots horizontally embedded by second zones 132 forming a grid or vice versa. According to other embodiments, the first and second zones 131, 132 may be stripes running parallel to a first horizontal direction or may form nested rectangular frames, by way of example. Control structures 150 of transistor cells TC, saturation injection cells AC2 and desaturation injection cells AC1 extend from the first surface 101 into the drift zone 121. Portions of the semiconductor body 100 between neighboring control structures 150 form cell mesas 170.

The control structures 150 may be stripes extending along an extension direction of the cell mesas 170. According to an embodiment the extension direction may be exclusively parallel to a first horizontal direction such that the cell mesas 170 and the control structures 150 are straight stripe structures. According to another embodiment, the extension direction alters with respect to the first horizontal direction such that the cell mesas 170 and the control structures 150 form staggered stripes.

The cell mesas 170 may be regularly arranged at a uniform center-to-center distance of, for example 400 nm to 20 µm, for example 800 nm to 2 µm. A distance between the first surface 101 and the bottom of the control structures 150 may range from 1 µm to 30 µm, e.g., from 2 µm to 6 µm. A lateral width of the cell mesas 170 may range from 0.05 µm to 10 µm, e.g., from 0.1 µm to 1 µm.

The control structures 150 include a gate electrode 155 and a gate dielectric 151 separating the gate electrode 155 from the semiconductor body 100. The gate electrode 155 may be a homogenous structure or may have a layered structure including one or more conductive layers. According to an embodiment the gate electrode 155 may include or consist of heavily doped polycrystalline silicon. The gate electrodes 155 may be electrically connected to a gate terminal G.

The gate dielectric 151 may include or consist of a semiconductor oxide, for example thermally grown or deposited silicon oxide, a semiconductor nitride, for example deposited or thermally grown silicon nitride, or a semiconductor oxynitride, for example silicon oxynitride.

Transistor cells TC, saturation injections cells AC2 and desaturation injections cells AC1 may be directly concatenated to each other along a horizontal direction.

FIG. 5A shows transistor cells TC, saturation injection cells AC2 and desaturation injection cells AC1 directly concatenated along a first horizontal direction defined by the longitudinal axes of the control structures 150. Transistor cells TC, saturation injection cells AC2 and desaturation injection cells AC1 may directly adjoin to each other, wherein transitions between the different cell types may be gradual or abrupt. According to other embodiments, the transistor cells TC and the desaturation injection cells AC1 are formed along different control structures 150 running parallel to each other.

The body zones 115 are formed in first sections of the cell mesas 170 oriented to the first surface 101 and may directly adjoin the first surface 101 in the saturation and desaturation injections cells AC2, AC1. A mean net impurity concentration in the body zones 115 may be in the range from $1E16$ cm$^{-3}$ to $5E18$ cm$^{-3}$, for example between $1E17$ cm$^{-3}$ and $5E17$ cm$^{-3}$. Each body zone 115 may form a first pn junction pn1 with the drift structure 120.

Portions of the cell mesas 170 assigned to the transistor cells TC include source zones 110 forming second pn junctions pn2 with the body zones 115 of the transistor cells TC. Portions of the cell mesas 170 assigned to the saturation and desaturation injections cells AC2, AC1 may be devoid of any source zone or include source zones without connection to the first load electrode 310.

The source zones 110 may be formed as wells extending from the first surface 101 into the body zones 115 and define the transistor cells TC which are arranged along a longitudinal horizontal axis of the respective cell mesa 170. Shadowed regions without source zones 110 separate neighboring transistor cells TC assigned to the same cell mesa 170, wherein in the shadowed regions the body zones 115 of the saturation and desaturation injections cells AC2, AC1 directly adjoin the first surface 101. Transistor cells TC and shadowed regions alternate along the longitudinal axis of the respective cell mesa 170.

A distance between neighboring source zones 110 arranged along the longitudinal axis may be in a range from 1 µm to 200 µm, for example in a range from 3 µm to 100 µm.

A dielectric structure 200 may separate the first load electrode 310 from the first surface 101. The dielectric structure 200 may include one or more dielectric layers from silicon oxide, silicon nitride, silicon oxynitride, doped or undoped silicon glass, for example BSG (boron silicate glass), PSG (phosphorus silicate glass), or BPSG (boron phosphorus silicate glass), by way of example.

The first load electrode 310 may form an emitter terminal E or may be electrically coupled or connected to an emitter terminal E of the RC-IGBT 501.

Contact structures 315 extend from the first load electrode 310 through the dielectric structure 200 into the semiconductor body 100. The contact structures 315 electrically connect the first load electrode 310 with the source zones 110 and the body zones 115. A plurality of spatially separated contact structures 315 may directly adjoin the respective cell mesa 170, wherein at least some of the contact structures 315 may be assigned to the source zones 110. Other embodiments may provide stripe-shaped contact structures 315 that extend along the whole longitudinal extension of the respective cell mesa 170 and that directly adjoin the body zones 115 in the shadowed regions.

A second load electrode 320 directly adjoins the second surface 102 and the pedestal layer 130. The second load electrode 320 may form or may be electrically connected to a collector terminal C.

Each of the first and second load electrodes 310, 320 may consist of or contain as main constituent(s) aluminum (Al), copper (Cu), or alloys of aluminum or copper, for example AlSi, AlCu or AlSiCu. According to other embodiments, at least one of the first and second load electrodes 310, 320 may contain as main constituent(s) nickel (Ni), titanium (Ti), tungsten (W), tantalum (Ta), silver (Ag), gold (Au), platinum (Pt), and/or palladium (Pd). For example, at least one of the first and second load electrodes 310, 320 may include two or more sub-layers, wherein each sub-layer contains one or more of Ni, Ti, Ag, Au, Pt, W, and Pd as main constituent(s), e.g., a silicide, a nitride and/or an alloy.

The cell mesas 170 further include a barrier structure 125 which may be sandwiched between the body zones 115 and the drift zone 121 such that the barrier structure 125 forms the first pn junctions pn1 with the body zones 115 and unipolar homojunctions with the drift zone 121. The barrier structure 125 has the same conductivity type as the drift zone 121. A mean dopant concentration in the barrier structure 125 is at least ten times as high as the mean dopant concentration in the drift zone 121. According to an embodiment, the mean dopant concentration in the barrier structure 125 may range from 1E16 cm$^{-3}$ to 1E18 cm$^{-3}$, for example from 1E17 cm$^{-3}$ to 5E17 cm$^{-3}$. The impurities in the barrier structure 125 may be phosphorous (P), arsenic (As), selenium (Se) and/or sulfur (S) atoms/ions in case of an n-channel IGBT 501.

According to other embodiments, the barrier structure 125 may be embedded within the body zones 115 such that portions of the body zones 115 separate the barrier structure 125 from the drift zone 121. According to further embodiments, the barrier structure 125 is formed within the drift zone 121 at a distance to the first pn junctions pn1.

In the conducting phase of the forward biased state, the barrier structure 125 forms a barrier for charge carriers to escape from the charge carrier plasma and increases charge carrier plasma density. Further, in the more heavily doped barrier structure 125 minority charge carriers recombine at a higher rate such that the barrier structure 125 reduces minority charge carrier emitter efficiency with respect to the drift zone 121. The barrier structure 125 is formed at least in the saturation injection cells AC2 and may also be formed in the transistor cells TC.

FIG. 5C shows gaps 125a in the barrier structure 125. The gaps 125a locally increase emitter efficiency with respect to the drift zone 121 and define the desaturation injection cells AC1.

Figure 6A:
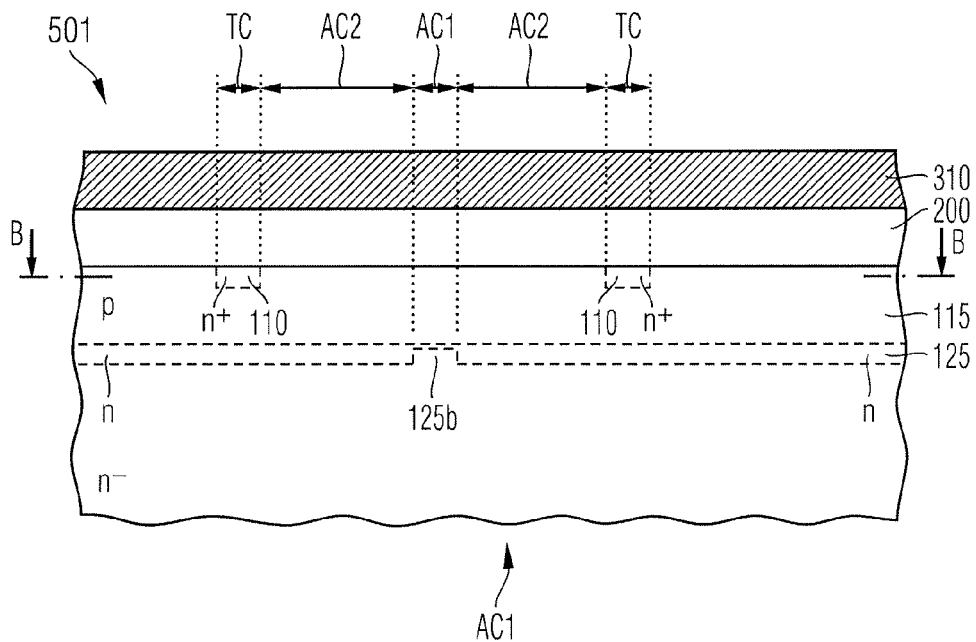
FIG. 6A is a schematic vertical cross-sectional view of a portion of an RC-IGBT along a longitudinal mesa axis according to an embodiment related to auxiliary cells defined by a barrier structure with locally attenuated portions.

The n-channel RC-IGBT 501 of FIG. 6A shows local attenuated portions 125b of the barrier structure 125 defining the desaturation injection cells AC1. In the desaturation injection cells AC1, the mean dopant concentration/dose in the attenuated portions 125b is at most 50%, for example at most 10% of the dopant concentration/dose in portions of the barrier structure 125 outside the attenuated portions 125b in the desaturation injection cells AC1.

Figure 6B:
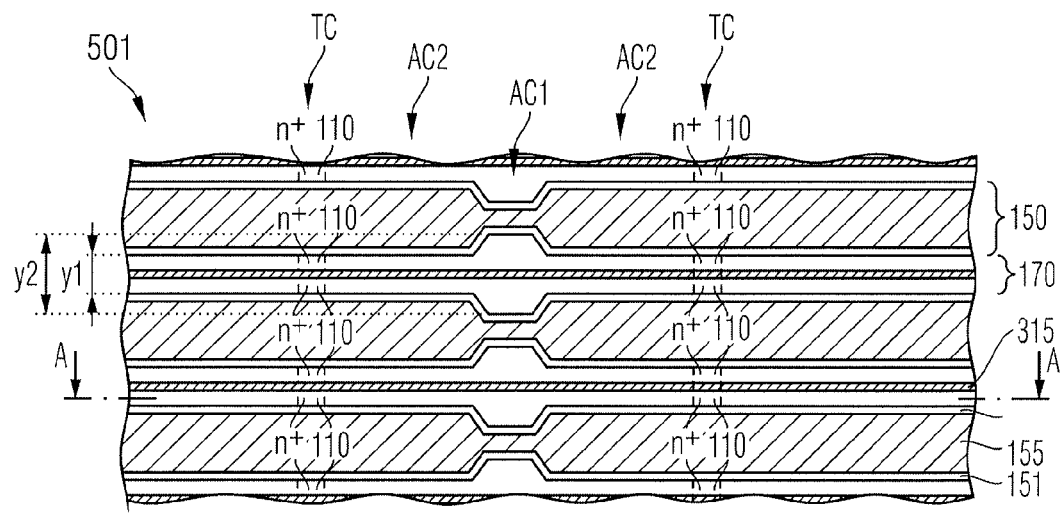
FIG. 6B is a schematic horizontal cross-sectional view of a portion of an RC-IGBT according to an embodiment related to auxiliary cells defined by a variation of a cell mesa width.

In FIG. 6B an RC-IGBT 501 includes saturation injections cells AC2 in narrow portions of cell mesas 170, wherein the narrow portions have a narrow mesa width y1, and desaturation injection cells AC1 in wide portions of cell mesas 170, wherein the wide portions have a wide mesa width y2. In the desaturation injection cells AC1 the local injection efficiency per cell length unit is higher than in the saturation injection cells AC2. But since the total area assigned to saturation injection cells AC2 is greater than the total area assigned to desaturation injection cells. AC1, for VGE<Vthp the total injection through the saturation injection cells AC2 may exceed the total injection through the desaturation injection cells AC1.

Figure 6C:
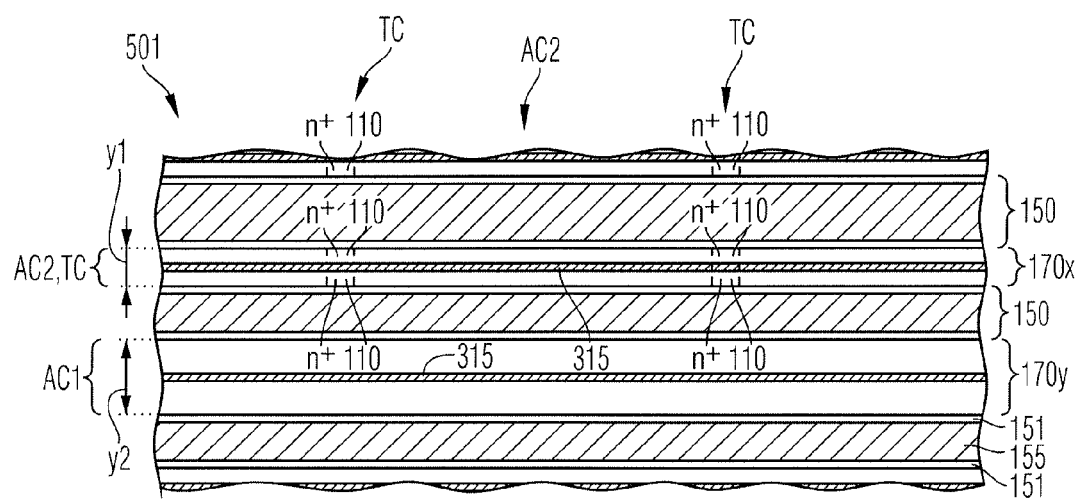
FIG. 6C is a schematic horizontal cross-sectional view of a portion of an RC-IGBT according to an embodiment related to auxiliary cells defined in mesas of different widths.

In FIG. 6C an RC-IGBT 501 includes saturation injections cells AC2 in narrow cell mesas 170x with a narrow mesa width y1 and desaturation injection cells AC1 in wide cell mesas 170y with a wide mesa width y2. According to an embodiment, the wide mesa width y2 may be in a range from 100 nm to 20 µm, e.g., in a range from 300 nm to 1000 nm or from 400 nm to 800 nm, whereas the narrow mesa width y1 may be in a range from 10 to 400 nm, e.g., in a range from 50 to 200 nm and wherein the wide mesa width y2 is at least 90 nm greater than the narrow mesa width y1.

The transistor cells TC may be formed in the narrow cell mesas 170x, in the wide cell mesas 170y, or in both of them. Though in the desaturation injection cells AC1 the local injection efficiency per cell length unit may be higher than in the saturation injection cells AC2, for VGE<Vthp the total injection through the saturation injection cells AC2 may exceed the total injection through the desaturation injection cells AC1 if the total area assigned to saturation injection cells AC2 is sufficiently great with respect to the total area assigned to the desaturation injection cells AC1.

The embodiments of FIGS. 6A to 6C may be combined with each other. For example, the RC-IGBT 501 of FIG. 6C may include a patterned barrier structure 125 as illustrated in FIG. 6A or a non-patterned barrier structure 125 or does not include any barrier structure.

Figure 7A:
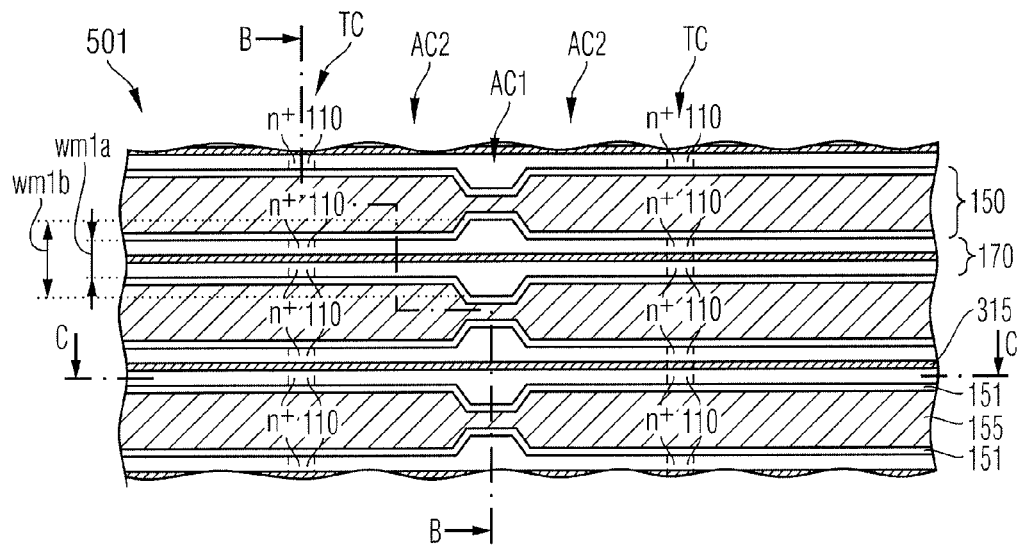
FIG. 7A is a schematic horizontal cross-sectional view of a portion of an RC-IGBT according to another embodiment related to auxiliary cells defined by locally widened cell mesas.
Figure 7B:
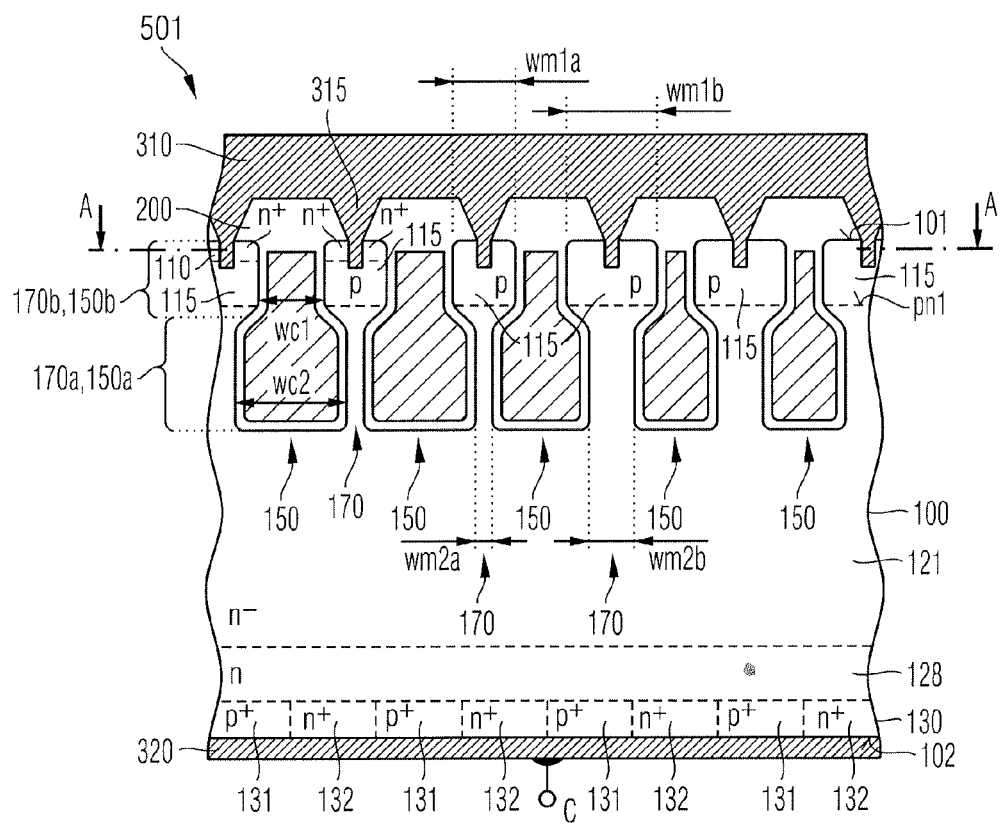
FIG. 7B is a schematic planar projection of a vertical cross-section of the semiconductor device portion of FIG. 7A along line B-B.
Figure 7C:
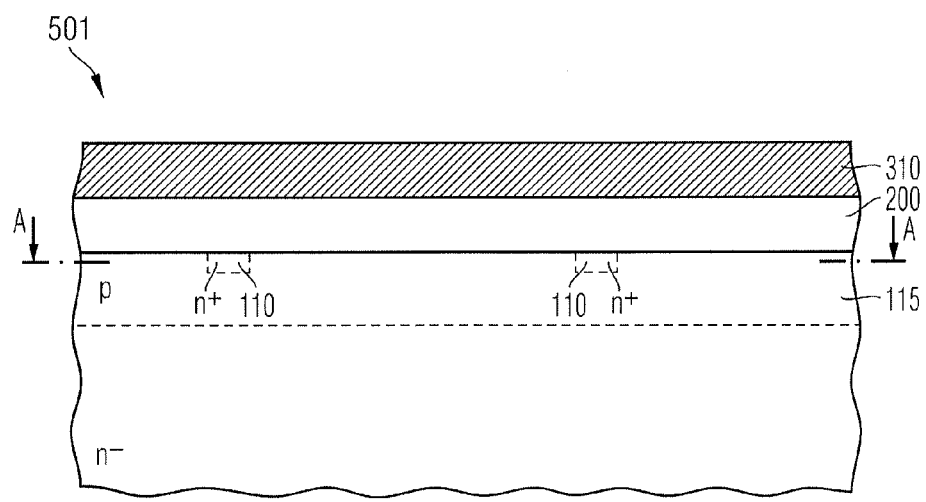
FIG. 7C is a schematic vertical cross-sectional view of the semiconductor device portion of FIG. 7A along line C-C.

FIGS. 7A to 7C refer to n-channel RC-IGBTs 501 with bottle-shaped control structures 150. The control structures 150 include bulged sections 150a and narrow sections 150b between the bulged sections 150a and the first surface 101, wherein the narrow sections 150b extend from the first surface 101 down to at least the first pn junction pn1. The narrow sections 150b have a width wc1. In the bulged sections 150a the control structures 150 have a maximum width wc2 which is greater than the first width wc1. The maximum width wc2 is at least 50 nm, for example at least 100 nm greater than the width wc1 of the narrow sections 150b.

Accordingly, the cell mesas 170 have wide sections 170b sandwiched between neighboring narrow sections 150b of the control structures 150 and bottleneck sections 170a sandwiched between neighboring bulged sections 150a of the control structures 150. The wide sections 170b include at least the body zones 115 and the first pn junctions pn1 as well as portions of the drift zone 121. A mesa width wm1a of wide sections 170b in portions of the cell mesas 170 assigned to transistor cells TC and saturation injection cells AC2 is in a range from 100 nm to 900 nm, for example in a range from 300 nm to 800 nm. A minimum mesa width wm2a of bottleneck sections 170a in portions of cell mesas 170 assigned to transistor cells TC and saturation injection cells AC2 may be in a range from 10 nm to 400 nm, for example in a range from 50 nm to 200 nm. The bottleneck sections 170a include portions of the drift zone 121 and may include portions of a barrier structure, respectively.

Mesa widths of the cell mesas 170 in the saturation injection cells AC2 may be the same as in the transistor cells TC. Portions of the cell mesas 170 assigned to the desaturation injection cells AC1 may be wider than portions of cell mesas 170 assigned to the saturation injection cells AC2. For example, a width wm2b of narrow portions of the bottleneck sections 170a of portions of cell mesas 170 in the desaturation injection cells AC1 is at least 10% greater, for example at least 30% greater than a width wm2a of narrow portions of the bottleneck sections 170a of portions of cell mesas 170 in the saturation injection cells AC2. For example, the width wm2b may be at least 50 nm, e.g., at least 150 nm greater than the width wm2a.

In the following, reference is made to the definition of threshold voltages in FIG. 1B. When a gate voltage VGE lower than the second threshold voltage Vthp is applied to the gate terminal G, p-type inversion layers are formed in the drift zone 121 around the control structures 150. The inversion layers are connected to the body zones 115 which in turn are connected to the first load electrode 310 such that the inversion layers in the drift zone 121 are effective as charge carrier emitters. The injected charge carriers increase charge carrier plasma density in the drift zone 121. A high charge carrier plasma density results in low forward resistance and low forward voltage of the reverse diode in the RC-mode of the RC-IGBT 501 during a saturation period. Both the bulgy form of the gate structures 150 and a barrier structure as illustrated in FIGS. 5A to 5C contribute to increasing the spread between the injection efficiencies at VGE<Vthp and at VGE>Vthp. The higher the spread is the better is the desaturation efficiency in the desaturation period.

During a desaturation period of the RC-mode preceding a commutation of the RC-IGBT 501, the gate voltage VGE is raised to a voltage greater than the second threshold voltage Vthp but lower than the further threshold voltage Vth0. The inversion channels dissipate. In the saturation injection cells AC2 the bulged sections 150a of the control structures 150 shield the body zones 115 against a contiguous portion of the drift structure 120 between the control structures 150 and the pedestal layer 130. The remaining charge carrier injection efficiency of the body zones 115 in the saturation injection cells AC2 is low.

Instead, in the desaturation injection cells AC1, the body zones 115 preserve a comparatively high injection rate through the wider bottleneck portions 170a of the cell mesas 170 despite the absence of p-type inversion layers along the control structures 150. The overall injection efficiency of the desaturation injection cells AC1 remains sufficiently high to ensure a sufficient charge carrier plasma density in the drift zone 121 during the desaturation period and a sufficiently low forward voltage drop across the reverse diode even in the desaturation period of the RC-mode. Due to the less critical mesa dimensions in the desaturation injection cells AC2, the forward voltage drop governed by the desaturation injection cells AC2 is less susceptible to dimensional variations and process fluctuations.

The RC-IGBT 501 combines a high spread of the overall injection efficiency and, as a consequence high desaturation efficiency, with a sufficient minimum injection efficiency in the desaturation period, and, as a consequence a stable forward voltage behavior in the RC-mode.

Figure 7D:
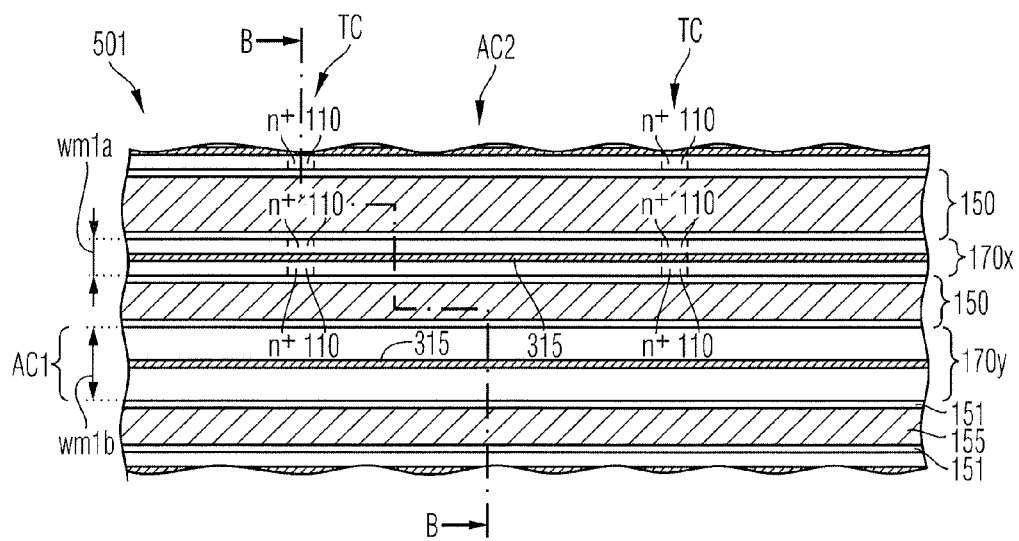
FIG. 7D is a schematic horizontal cross-sectional view of a portion of an RC-IGBT according to another embodiment related to first auxiliary cells in wide cell mesas and second auxiliary cells in narrow cell mesas.

FIG. 7D refers to a layout with the desaturation injection cells AC1 formed in wide cell mesas 170y that have a mesa width wm1b greater than a mesa width wm1a of narrow cell mesas 170x including the saturation injection cells AC2 or the saturation injection cells AC2 and the transistor cells TC. The cross-section along line B-B may correspond to the cross-section along line B-B in FIG. 7A with the mesa widths wm1a and wm1b referring to the widths of the wide mesa sections of bottleneck mesas. The wide cell mesas 170y may include source zones 110 or may be devoid of source zones 110. Transistor cells TC and saturation injection cells AC1 may be formed in the same narrow cell mesas 170x or in different narrow cell mesas 170y.

According to another embodiment, the drift structure 120 includes barrier structures as illustrated in FIGS. 5A to 5C and the sidewalls of the wide and narrow cell mesas 170y, 170x may be approximately vertical.

Figure 8B:
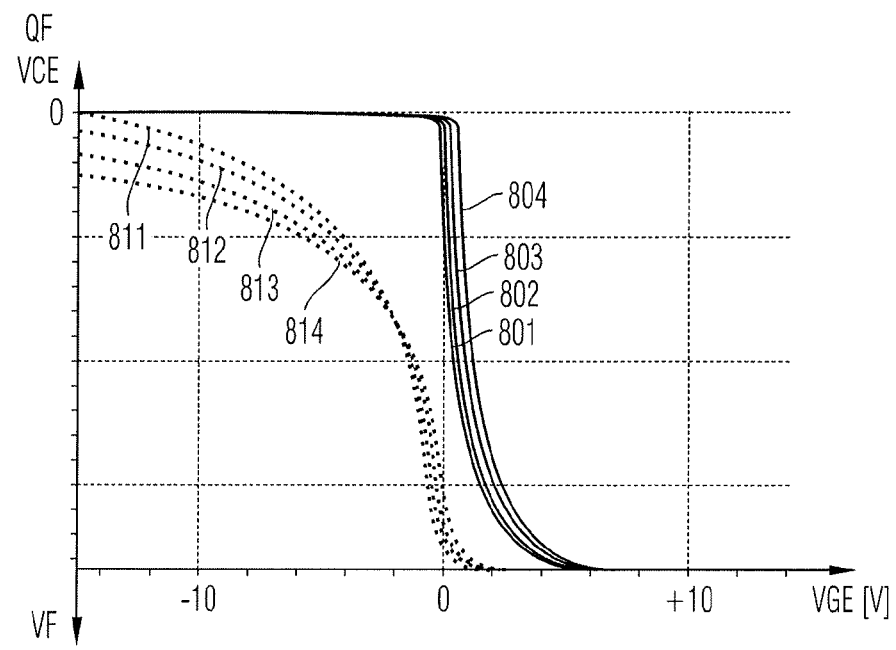
FIG. 8B is a schematic diagram plotting collector-to-emitter voltage VCE and storage charge QF of the injection cells of FIG. 8A against the gate voltage for different vertical extensions of narrow portions of the bottleneck sections.
Figure 8C:
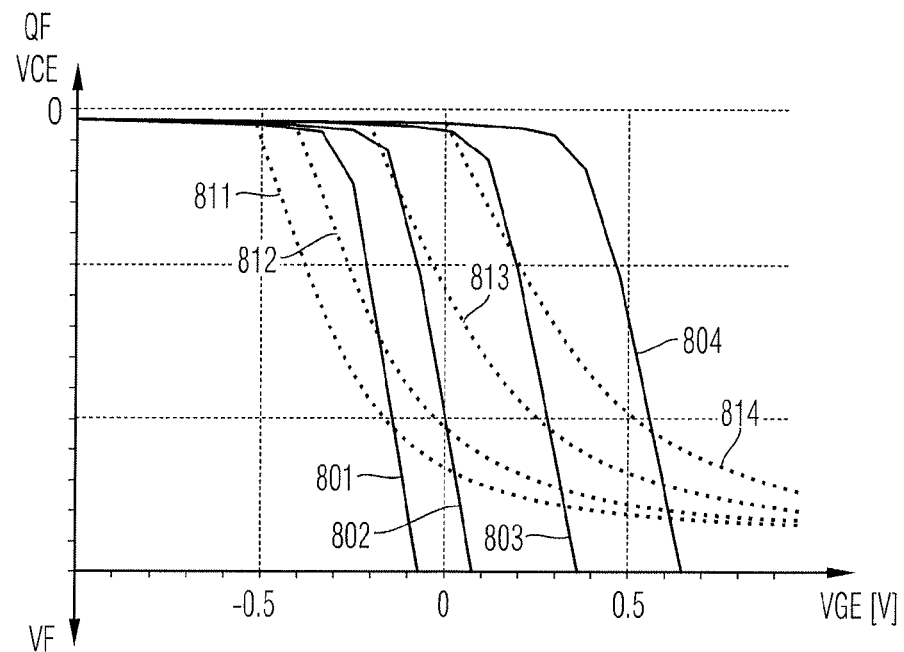
FIG. 8C shows a section of the diagram of FIG. 8B around a gate voltage of 0V in detail.

FIGS. 8A to 8C illustrate the correlation of the forward voltage VF of the reverse diode in the RC-mode, the storage charge QF in the drift zone 121 and the vertical extension of a narrow portion in the bottleneck section of the cell mesas 170.

FIG. 8A shows injection cells AC which control structures 150 have a total vertical extension of about 5 μm. The control structures 150 are bottle-shaped with a minimum width wc1 in a narrow section 150b close to the first surface 101 and a maximum width wc2 in a bulged section 150a in a distance to the first surface 101. The minimum width wc1 is about 1 μm and the maximum width wc2 is about 1.2 μm.

The cell mesas 170 include bottleneck sections 170a with a width wm2 of about 200 nm in a narrow portion of approximately constant width and wide sections 170b between the first surface 101 and the bottleneck sections 170a with a width wm1 of about 400 nm. The wide sections 170b include the body zones 115. A width of the first pn junctions pn1 approximates the width wm1 of the wide sections 170b. The vertical extension of the narrow portions of the bottleneck sections 170a may be in a range from 300 nm to 4 μm.

In FIG. 8B the contiguous lines 801-804 show the collector-to-emitter voltage VCE in the RC-mode of an RC-IGBT including the injection cells AC of FIG. 8A as a function of the gate voltage VGE at vertical extensions of the narrow portions of the bottleneck sections 170a of 2.5 μm (801), 2.1 μm (802), 1.8 μm (803) and 1.5 μm (804). The dotted lines 811, 812, 813, 814 show the storage charge QF, which is proportional to the injection efficiency, at a vertical extension of the narrow portions of the bottleneck sections of the cell mesas 170 of 2.5 μm (811), 2.1 μm (812), 1.8 μm (813) and 1.5 μm (814). The amount of current that flows through the structure does not depend on the gate voltage VGE and is in the range of the nominal value.

FIG. 8C shows a portion of the diagram of FIG. 8B around VGE=0 in more detail.

Both the collector-to-emitter voltage VCE and the storage charge QF strongly depend on the gate voltage VGE and strongly vary at and around VG=0 V. The collector-to-emitter voltage gradient 804 assigned to a vertical extension of the narrow portion of 1.5 μm ensures a low forward voltage drop for the respective injection cell at VG=0, which is the typical gate voltage level for the desaturation mode of a three-level desaturable RC-IGBT. On the other hand, process fluctuations may result in that the vertical extension of the narrow portions of the bottleneck sections is smaller than 1.8 μm, resulting in the collector-to-emitter voltage gradient 802 and a forward voltage VF of the concerned injection cells AC of more than 100 V.

The embodiments allow for combining injection cells AC with the charge storage gradient 811 ensuring a high spread of the charge storage between VGE=−15V and VGE=0V with injection cells having a collector-to-emitter voltage gradient similar to the collector-to-emitter voltage gradient 804 ensuring a low voltage drop even at a desaturation gate voltage VG=0V.

Figure 9A:
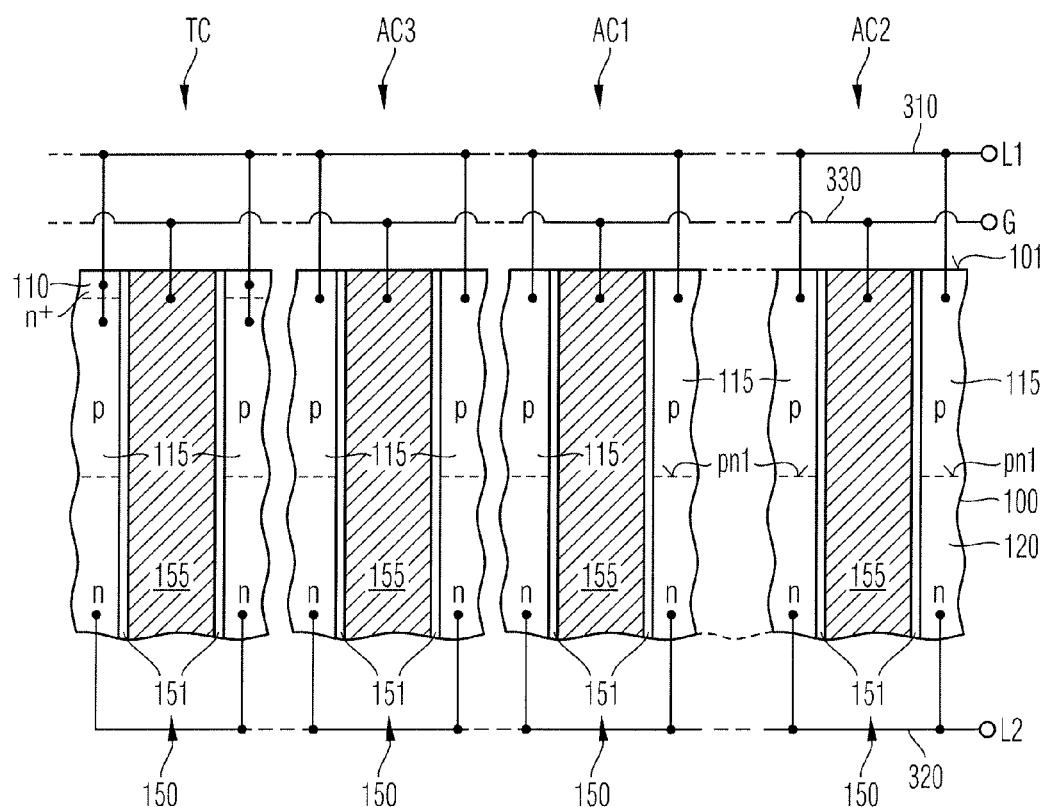
FIG. 9A combines schematic vertical cross-sectional views of portions of a semiconductor device according to an embodiment related to meta cells.
Figure 9B:
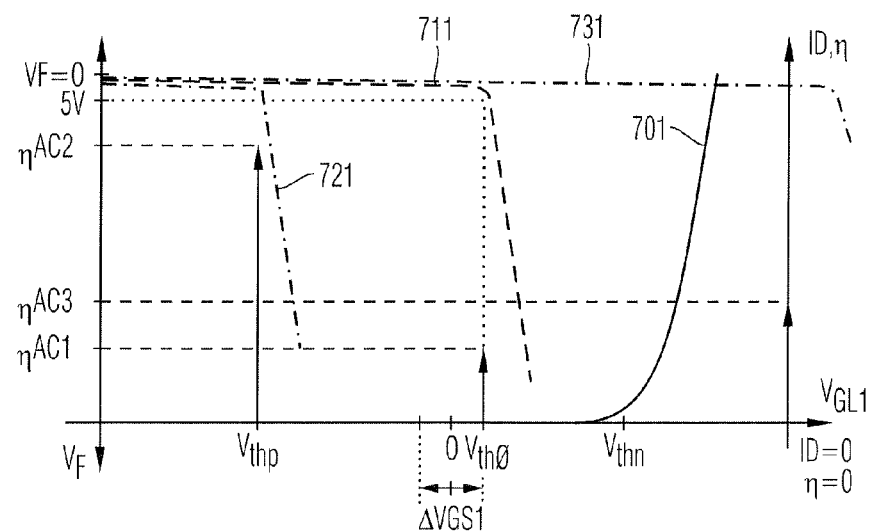
FIG. 9B is a schematic diagram for illustrating the effect of the meta cells in FIG. 9A.

FIGS. 9A to 9B refer to embodiments including, in addition to the first and second auxiliary cells AC1, AC2 third auxiliary cells AC3 (meta cells) for maintaining a sufficient degree of charge carrier injection even at a gate voltage VGL1 that exceeds the first threshold voltage Vthn, which is the threshold voltage for the MOS gated channels through the body zones 115 in the transistor cells TC.

The meta cells AC3 may be evenly distributed among the transistor cells TC, the saturation injection cells AC2 and the desaturation injection cells AC1. The meta cells AC3 are designed such that they have a sufficiently high charge carrier injection efficiency even at gate voltage levels above the first threshold voltage Vthn. In an n-channel RC-IGBT, the meta cells AC3 are effective as hole emitters even if a positive gate voltage VGE induces inversion channels through the body zones 115 of the transistor cells TC.

In a typical three-level operation mode for desaturable n-channel RC-IGBTs, a negative gate voltage VGE is used to increase the hole injection efficiency in injection cells. A gate voltage VGE of about 0 V is applied for a desaturation period in which injection efficiency of the injection cells is reduced.

On the other hand, typical applications of RC-IGBTs include driver units controlling the gate voltage of the RC-IGBT and sensing a current, wherein the driver unit may turn the RC-IGBT on when the sensed current is below a certain threshold, which may be about 10% of a nominal collector current $I_{C,nom}$ the RC-IGBT is specified for. Since for low currents the driver units typically do not always reliably detect the actual current direction, the driver unit may turn on the RC-IGBT even if the RC-IGBT is reversed biased. As a result, the driver unit may apply a gate voltage VGE of +15 V to the gate terminal of the RC-IGBT even in the RC-mode. For this case, the meta cells AC3 may ensure that sufficient holes are injected into the drift structure 120 to maintain a sufficiently dense charge carrier plasma and to avoid a runaway of the voltage drop across the reverse diode in the RC-mode. The meta cells AC3 inject sufficient charge carriers for maintaining a bipolar current at gate voltages above the first threshold voltage Vthn.

The three types of auxiliary cells including saturation injection cells AC2, desaturation injection cells AC1 and meta cells AC3 allow for adapting the modes of operation below Vthp, between Vthp and Vth0 and above Vth0 in the RC-mode independently from each other. The meta cells AC3 may be arranged exclusively in the bipolar regions, e.g., exclusively in the vertical projection of collector channels 132. Meta cells AC3 may have a reduced anode efficiency compared to the injection cells AC1. The meta cells AC3 may be defined by local dimension variations of the body zones 115 or by a variation of the vertical dopant profiles in the cell mesas 170.

According to an embodiment, the body zones 115 in the meta cells AC3 may have a lower dopant dose/concentration than the body zones 115 of the saturation and desaturation injection cells AC2, AC1. According to another embodiment, a dopant concentration in the drift zone 121 along the first pn junctions pn1 is increased and may form a local barrier structure 125 or a locally enhanced portion 125c of a barrier structure 125 extending along the first pn junctions pn1. According to other embodiments, an increased concentration of recombination centers may reduce the effective dopant concentration in the body zones 115. Another embodiment may increase the width of the cell mesas 170 in the meta cells AC3.

Transitions between the meta cells AC3 and adjoining transistor cells TC, saturation injection cells AC2 or desaturation injection cells AC1 may be smooth or steep. The different cell types may alternate along the same cell mesa 170 or may be formed in different cell mesas 170. Since the function of the meta cells AC3 includes to inject charge carriers even when the MOS gated channels in the transistor cells are turned on, the meta cells AC3 are formed in a minimum distance of at least 5 µm, e.g., at least 20 µm to the transistor cells TC and at least one of a desaturation injection cell AC1 and a saturation cell AC2 extends from the transistor cell TC to the meta cell AC3.

Figure 10A:
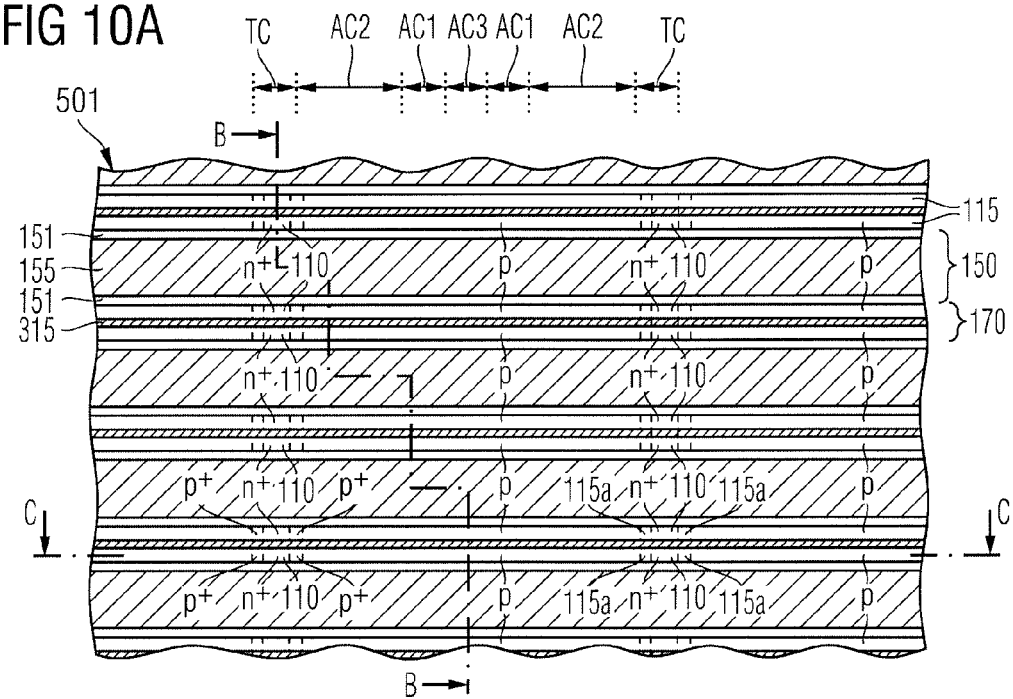
FIG. 10A is a schematic horizontal cross-sectional view of a portion of a semiconductor device in accordance with an embodiment concerning RC-IGBTs with meta cells.
Figure 10B:
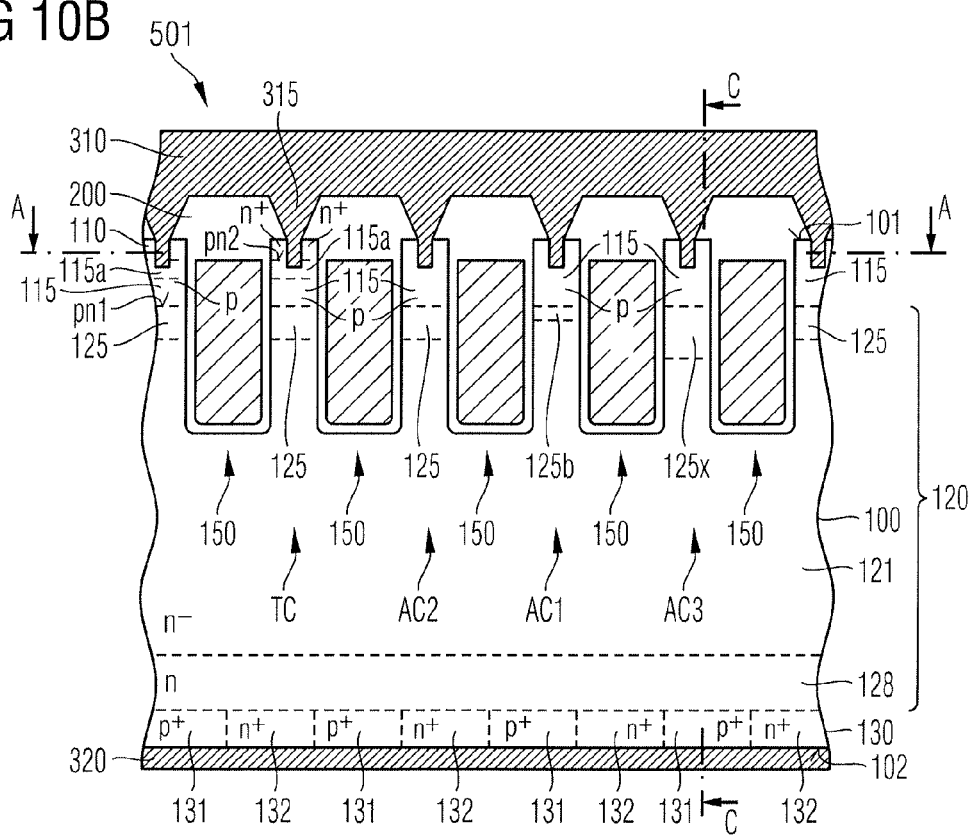
FIG. 10B is a schematic planar projection of a vertical cross-section of the semiconductor device portion of FIG. 10A along line B-B.
Figure 10C:
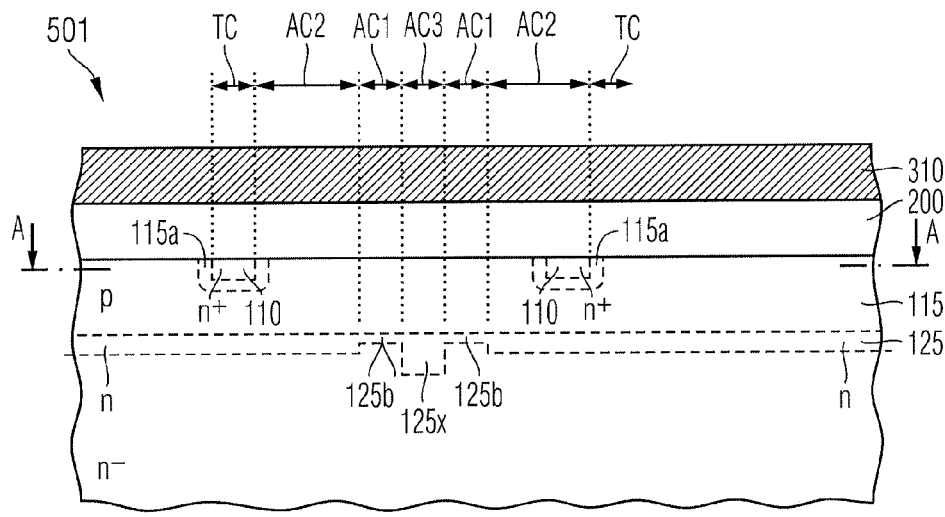
FIG. 10C is a schematic vertical cross-sectional view of the semiconductor device portion of FIG. 10A along line C-C.

FIGS. 10A to 10C refer to an embodiment with meta cells AC3 directly adjoining the transistor cells TC. In the meta cells AC3, enhanced sections 125x of the barrier zones 125 may locally reduce the injection efficiency of the body zones 115.

Along the contact structures 315 the body zones 115 of the transistor cells TC may include heavily doped contact zones 115a that improve the ohmic contact and overcurrent switching ruggedness in the transistor cells TC. By contrast, the body zones 115 of the saturation and desaturation injection cells AC1, AC2 may be devoid of heavily doped contact zones 115.

In addition, outside the contact zones 115a the body zones 115 of the transistor cells TC may have a higher dopant concentration than the body zones 115 of the desaturation injection cells AC1, the saturation injection cells AC2, or both such that emitter efficiency of the body zones in the concerned injections cells is lower than in the transistor cells TC.

Figure 11:
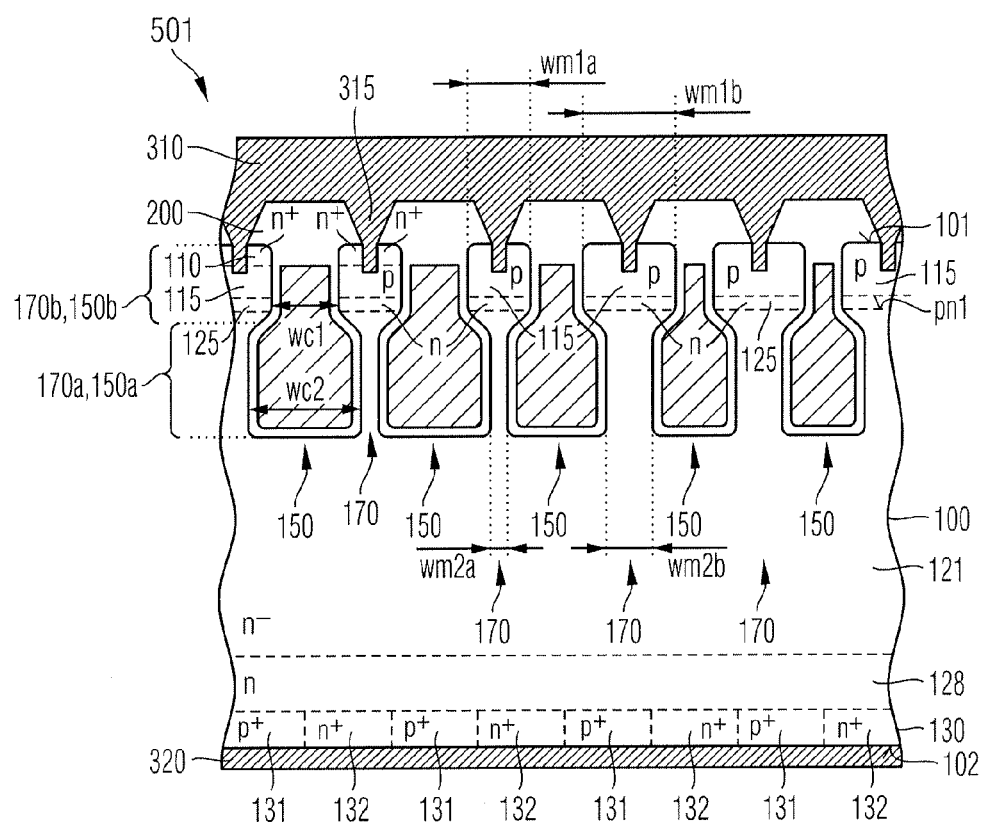
FIG. 11 is a schematic planar projection of a vertical cross-section of a semiconductor device according to an embodiment combining barrier structures with bottle shaped gate structures.

The RC-IGBT 501 illustrated in FIG. 11 combines a barrier structure 125 with cell mesas 170 with bottleneck sections 170a as described with reference to FIGS. 7A to 7C. In the illustrated embodiment the barrier structure 125 is uniform. According to other embodiments the barrier structure 125 may be patterned and may include gaps or attenuated portions in the desaturation injection cells AC1 as described with reference to FIGS. 5A to 6A. Further embodiments may include meta cells AC3 as described with reference to FIGS. 9A to 10C.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising:
    transistor cells configured to connect a first load electrode with a drift structure forming first pn junctions with body zones when a gate voltage applied to a gate electrode exceeds a first threshold voltage;
    first auxiliary cells in a vertical projection of and electrically connected with the first load electrode and configured to inject charge carriers into the drift structure at least in a forward biased mode of the first pn junctions; and
    second auxiliary cells configured to inject charge carriers into the drift structure at high emitter efficiency when in the forward biased mode of the first pn junctions the gate voltage is below a second threshold voltage lower than the first threshold voltage and at low emitter efficiency when the gate voltage exceeds the second threshold voltage.

2. The semiconductor device according to claim 1, wherein
    the first auxiliary cells are configured to inject charge carriers into the drift structure at high emitter efficiency when the gate voltage is below a further threshold voltage between the first threshold voltage and the second threshold voltage and at low emitter efficiency when the gate voltage exceeds the further threshold voltage.

3. The semiconductor device of claim 1, wherein
    at a gate voltage below the further threshold voltage an increase of the forward voltage drop across the first auxiliary cells with increasing gate voltage is less steep than above the further threshold voltage.

4. The semiconductor device of claim 1, wherein
    at a gate voltage below the second threshold voltage an increase of the forward voltage drop across the second auxiliary cells with increasing gate voltage is less steep than above the further threshold voltage.

5. The semiconductor device of claim 1, wherein at a gate voltage below the second threshold voltage an injection efficiency at which the second auxiliary cells inject minority charge carriers into the drift structure is higher than above the second threshold voltage.

6. The semiconductor device of claim 1, wherein at a gate voltage below the second threshold voltage a total injection of minority charge carriers into the drift structure is higher by the second auxiliary cells than by the first auxiliary cells.

7. The semiconductor device of claim 1, further comprising:
a pedestal layer between the drift structure and a second load electrode, the pedestal layer including first zones and oppositely doped second zones separating the first zones, wherein the first zones and the second zones extend from the drift structure to the second load electrode, respectively.

8. The semiconductor device of claim 7, wherein the first and second zones are formed in a bimodal region and the pedestal layer further comprises a pilot region comprising a pilot zone of the conductivity type of the first zones, wherein at least one horizontal dimension of the pilot zone exceeds at least twice a corresponding horizontal dimension of the first zones.

9. The semiconductor device of claim 8, wherein the first auxiliary cells are arranged in the pilot region.

10. The semiconductor device of claim 9, wherein the first auxiliary cells are arranged in a center of the pilot region.

11. The semiconductor device of claim 9, wherein the first auxiliary cells are arranged in a peripheral portion of the pilot region.

12. The semiconductor device of claim 8, wherein the first auxiliary cells are arranged in the bimodal region.

13. The semiconductor device of claim 12, wherein the first auxiliary cells are formed in the bimodal region in a stripe surrounding the pilot region.

14. The semiconductor device of claim 8, wherein the bimodal region surrounds the pilot region.

15. The semiconductor device of claim 1, wherein the first auxiliary cells are evenly distributed.

16. The semiconductor device of claim 1, wherein the drift structure includes a drift zone and a barrier structure between the drift zone and the body zones at least in the second auxiliary cells, and a mean dopant concentration in the barrier structure is at least ten times as high as a mean dopant concentration in the drift zone.

17. The semiconductor device of claim 16, wherein the barrier structure comprises a gap in the first auxiliary cells.

18. The semiconductor device of claim 16, wherein in the first auxiliary cells a mean dopant concentration in attenuated portions of the barrier structure is at most 50% of a mean dopant concentration in portions of the barrier structure in the second auxiliary cells.

19. The semiconductor device of claim 1, wherein the body zones are formed in cell mesas between gate structures including the gate electrode and extending from a first surface of a semiconductor body comprising the drift structure and the body zones into the drift structure.

20. The semiconductor device of claim 19, wherein cell mesas or portions of cell mesas assigned to the first auxiliary cells are wider than cell mesas or portions of cell mesas assigned to the second auxiliary cells.

21. The semiconductor device of claim 19, wherein the cell mesas comprise bottleneck sections and wide sections between the bottleneck sections and the first surface, wherein the wide sections are wider than narrow portions of the bottleneck sections.

22. The semiconductor device of claim 21, wherein the narrow portions of the bottleneck sections of the first auxiliary cells are wider than the narrow portions of the bottleneck sections of the second auxiliary cells.

23. The semiconductor device of claim 1, further comprising:
third auxiliary cells configured to inject charge carriers into the drift structure at a high emitter efficiency, when in a forward biased mode of the first pn junctions the gate voltage exceeds the first threshold voltage, wherein
the first auxiliary cells are configured to inject charge carriers into the drift structure at a high emitter efficiency when the gate voltage is below a further threshold voltage between the first threshold voltage and the second threshold voltage and at a low emitter efficiency when the gate voltage exceeds the further threshold voltage.

24. The semiconductor device of claim 1, wherein the first auxiliary cells are formed in wide cell mesas and the second auxiliary cells are formed in narrow cell mesas.

25. A semiconductor device comprising:
a semiconductor body comprising a drift structure and cell mesas formed between gate structures extending from a first surface of the semiconductor body into the drift structure, the cell mesas comprising bottleneck sections and wide sections between the bottleneck sections and the first surface, wherein the wide sections are wider than narrow portions of the bottleneck sections;
transistor cells comprising body zones forming first pn junctions with the drift structure and second pn junctions with source zones;
first auxiliary cells electrically connected in parallel to the transistor cells; and
second auxiliary cells electrically connected in parallel to the transistor cells, wherein the narrow portions of the bottleneck sections in the first auxiliary cells are wider than the narrow portions of the bottleneck sections in the second auxiliary cells.

* * * * *